(12) United States Patent
Kim

(10) Patent No.: US 10,748,998 B2
(45) Date of Patent: Aug. 18, 2020

(54) SEMICONDUCTOR DEVICES HAVING ALTERNATING CONNECTING AND SEPARATING SECTIONS BELOW THE GATE ELECTRODE

(71) Applicant: Samsung Electronics Co., Ltd., Suwon-si, Gyeonggi-do (KR)

(72) Inventor: Myoung Soo Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/253,616

(22) Filed: Jan. 22, 2019

(65) Prior Publication Data

US 2019/0393309 A1    Dec. 26, 2019

(30) Foreign Application Priority Data

Jun. 22, 2018    (KR) .................. 10-2018-0071790

(51) Int. Cl.
| | |
|---|---|
| *H01L 29/10* | (2006.01) |
| *H01L 29/06* | (2006.01) |
| *H01L 29/66* | (2006.01) |
| *H01L 27/08* | (2006.01) |
| *H01L 27/088* | (2006.01) |
| *H01L 21/8234* | (2006.01) |

(52) U.S. Cl.
CPC .. *H01L 29/1083* (2013.01); *H01L 21/823493* (2013.01); *H01L 27/088* (2013.01); *H01L 29/0653* (2013.01); *H01L 29/66537* (2013.01)

(58) Field of Classification Search
CPC ............ H01L 29/1083; H01L 29/0653; H01L 29/66537; H01L 27/088
See application file for complete search history.

(56) References Cited

U.S. PATENT DOCUMENTS

| | | | |
|---|---|---|---|
| 6,788,562 B2 * | 9/2004 | Nishizaka | G11C 7/18 257/E27.103 |
| 7,285,831 B2 | 10/2007 | Jung et al. | |
| 7,309,626 B2 | 12/2007 | Ieong et al. | |

(Continued)

FOREIGN PATENT DOCUMENTS

| | | |
|---|---|---|
| KR | 10-0343147 | 6/2002 |
| KR | 10-0531960 B1 | 11/2005 |

(Continued)

*Primary Examiner* — Ida M Soward
(74) *Attorney, Agent, or Firm* — Myers Bigel, P.A.

(57) ABSTRACT

A semiconductor device in which a threshold voltage is adjusted by a simplified process and in which current characteristics are improved may include a device isolation layer defining an active region in a substrate, a gate electrode extending in a first direction on the active region, a high-concentration impurity region in the active region on a side of the gate electrode and extending in the first direction, and a low-concentration impurity region at least partly surrounding the high-concentration impurity region. The active region may include a plurality of connecting sections below the gate electrode that protrude from the low-concentration impurity region and extend in a second direction that intersects the first direction. The device isolation layer may include a plurality of separating sections that separate the connecting sections from each other.

20 Claims, 20 Drawing Sheets

(56) References Cited

U.S. PATENT DOCUMENTS

| | | | |
|---|---|---|---|
| 7,391,071 B2* | 6/2008 | Park | H01L 27/115 |
| | | | 257/296 |
| 7,528,455 B2 | 5/2009 | Ahn | |
| 7,579,647 B2* | 8/2009 | Shimizu | H01L 27/115 |
| | | | 257/316 |
| 7,619,277 B2* | 11/2009 | Wu | H01L 27/115 |
| | | | 257/321 |
| 7,648,881 B2* | 1/2010 | Lee | H01L 27/105 |
| | | | 257/324 |
| 7,674,679 B2* | 3/2010 | Kinoshita | H01L 27/115 |
| | | | 257/300 |
| 7,679,129 B1* | 3/2010 | Hui | H01L 27/11521 |
| | | | 257/316 |
| 7,849,431 B2 | 12/2010 | Kim | |
| 7,906,399 B2 | 3/2011 | Ahn | |
| 8,012,829 B2* | 9/2011 | Joo | H01L 27/115 |
| | | | 438/259 |
| 8,058,161 B2* | 11/2011 | Barna | H01L 21/76232 |
| | | | 257/E21.429 |
| 8,569,144 B2* | 10/2013 | Funayama | H01L 21/76229 |
| | | | 257/E21.548 |
| 8,716,786 B2 | 5/2014 | Baumgartner et al. | |
| 8,953,356 B2* | 2/2015 | Han | G11C 5/025 |
| | | | 365/63 |
| 8,957,474 B2* | 2/2015 | Kim | H01L 27/088 |
| | | | 257/334 |
| 9,035,419 B2* | 5/2015 | Oh | H01L 21/76224 |
| | | | 257/522 |
| 9,331,204 B2 | 5/2016 | Lue | |
| 9,799,607 B2* | 10/2017 | Song | H01L 27/088 |
| 9,887,210 B2* | 2/2018 | Song | G06F 17/505 |
| 10,283,502 B2* | 5/2019 | Yoon | H01L 27/088 |
| 10,418,484 B1* | 9/2019 | Xie | H01L 27/088 |
| 10,490,665 B2* | 11/2019 | Kim | H01L 29/785 |
| 2002/0190799 A1* | 12/2002 | Morimoto | H03F 3/345 |
| | | | 331/57 |
| 2007/0152281 A1 | 7/2007 | Ahn | |
| 2007/0267692 A1* | 11/2007 | Joo | H01L 27/115 |
| | | | 257/330 |
| 2010/0187656 A1* | 7/2010 | Ke | H01L 29/73 |
| | | | 257/586 |
| 2012/0264269 A1* | 10/2012 | Ke | H01L 29/73 |
| | | | 438/309 |
| 2014/0061787 A1* | 3/2014 | Kim | H01L 29/36 |
| | | | 257/339 |
| 2015/0333077 A1* | 11/2015 | Tsai | H01L 21/26586 |
| | | | 257/319 |
| 2016/0086947 A1* | 3/2016 | Park | H01L 27/092 |
| | | | 257/369 |
| 2017/0025533 A1 | 1/2017 | Phoa et al. | |
| 2018/0315767 A1* | 11/2018 | Shukuri | B82Y 10/00 |
| 2019/0287969 A1* | 9/2019 | Choi | H01L 27/0922 |

FOREIGN PATENT DOCUMENTS

| | | |
|---|---|---|
| KR | 10-0650867 B1 | 11/2006 |
| KR | 10-0654053 B1 | 11/2006 |
| KR | 10-0688753 B1 | 2/2007 |
| KR | 10-0713327 B1 | 5/2007 |

* cited by examiner

SEMICONDUCTOR DEVICES HAVING ALTERNATING CONNECTING AND SEPARATING SECTIONS BELOW THE GATE ELECTRODE

CROSS REFERENCE TO RELATED APPLICATION

This application claims priority under 35 U.S.C. § 119, and all the benefits accruing therefrom, to Korean Patent Application No. 10-2018-0071790, filed on Jun. 22, 2018, the disclosure of which is incorporated by reference herein in its entirety.

TECHNICAL FIELD

The present disclosure relates to semiconductor devices, methods for fabricating semiconductor devices, and layout design methods for semiconductor devices. More specifically, the present disclosure relates to semiconductor devices that include high-voltage transistors, methods for fabricating the semiconductor device, and a layout design methods for the semiconductor devices.

BACKGROUND

Semiconductor elements may include transistors of various sizes driven at various voltages. Among the various transistors, high-voltage transistors driven at high voltage may require a thick, or relatively thick, gate dielectric layer. Further, in order to prevent punchthrough and strengthen breakdown voltage characteristics, a source/drain of the high-voltage transistor may be formed as an LDD (Lightly Doped Drain) structure or a DDD (Double Doped Drain) structure including a low-concentration impurity region and/or a high-concentration impurity region.

For example, the source/drain of the high-voltage transistor may be formed as a FLDD (Field Drift Lightly Doped Drain) structure or a MLDD (Modified Lightly Doped Drain) structure.

SUMMARY

Aspects of the present disclosure provide semiconductor devices in which a threshold voltage is adjusted by a simplified process and in which desirable current characteristics are present.

Aspects of the present inventive concepts provide a method for fabricating a semiconductor device in which a threshold voltage is adjusted by a simplified process and in which desirable current characteristics are present.

Aspects of the present inventive concepts provide a layout design method for a semiconductor device in which a threshold voltage is adjusted by a simplified process and in which desirable current characteristics are present.

The aspects of the present inventive concepts are not limited to those mentioned above and other aspects which are not explicitly mentioned herein may nevertheless be appreciated by those skilled in the art from the description below.

According to aspects of the present inventive concepts, there is provided a semiconductor device comprising a device isolation layer which defines an active region in a substrate, the substrate doped with a first conductivity type, a gate electrode extending in a first direction on the active region, a high-concentration impurity region in the active region on a side wall of the gate electrode, the high-concentration impurity region extending in the first direction and doped with a second conductivity type different from the first conductivity type, and a low-concentration impurity region in the active region, the low-concentration impurity region surrounding the high-concentration impurity region and doped with the second conductivity type, wherein the active region includes a plurality of connecting sections below the gate electrode, the plurality of connecting sections protruding from the low-concentration impurity region and extending in a second direction intersecting the first direction, the device isolation layer includes a plurality of separating sections below the gate electrode, and the plurality of connecting sections and the plurality of separating sections are alternately arranged along the first direction.

According to aspects of the present inventive concepts, there is provided a semiconductor device comprising a device isolation layer which defines an active region in a substrate, a gate electrode extending in a first direction on the active region, a first source/drain region extending in the first direction in the active region on one side of the gate electrode, a second source/drain region extending in the first direction in the active region on the other side of the gate electrode, wherein the active region includes a plurality of connecting sections which connects the first source/drain region and the second source/drain region, and is spaced apart from each other by the device isolation layer, a voltage of 5V to 100V is applied to the gate electrode, and a width of each of the connecting sections in the first direction is 10 μm or less.

According to aspects of the present inventive concepts, there is provided a semiconductor device comprising a substrate including a first region and a second region, a device isolation layer which defines an active region in the substrate, a first transistor on the first region, and a second transistor of the same conductivity type as the first transistor on the second region, wherein the first transistor includes a first gate electrode extending in a first direction on the active region, the second transistor includes a second gate electrode extending in a second direction on the active region, the active region of the first region includes a plurality of first connecting sections spaced apart from each other by the device isolation layer, below the first gate electrode, the active region of the second region includes a plurality of second connecting sections spaced apart from each other by the device isolation layer, below the second gate electrode, a first width of each of the first connecting sections in the first direction is smaller than a second width of each of the second connecting sections in the second direction, and a first threshold voltage of the first transistor is lower than a second threshold voltage of the second transistor.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION

A semiconductor device according to some embodiments of the present inventive concepts will be described referring to FIGS. 1 to 13.

Figure 1:
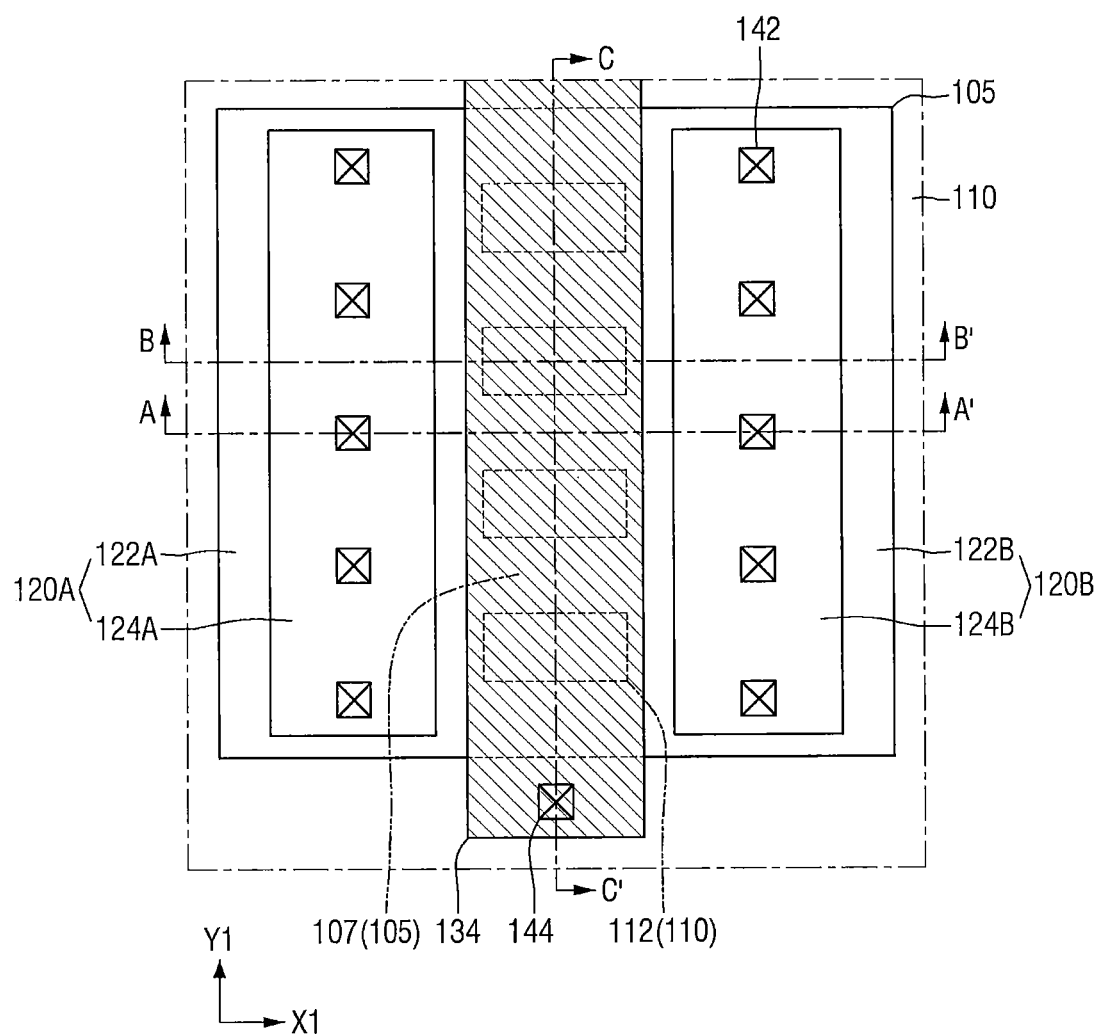
FIG. 1 is a layout diagram of a semiconductor device according to some embodiments of the present inventive concepts.
Figure 2:
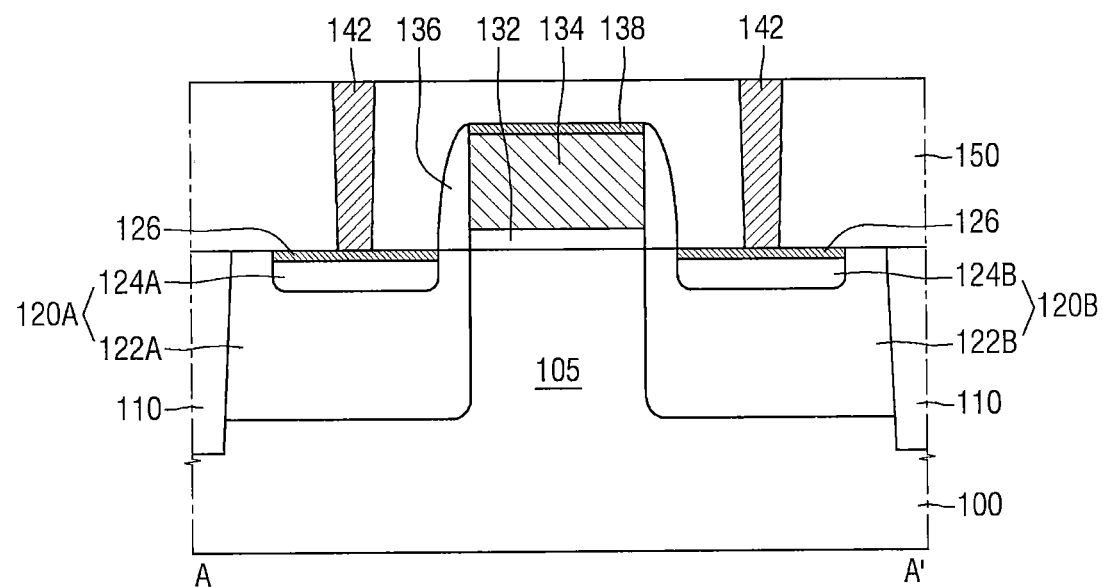
FIG. 2 is a cross-sectional view taken along line A-A' of FIG. 1.
Figure 3:
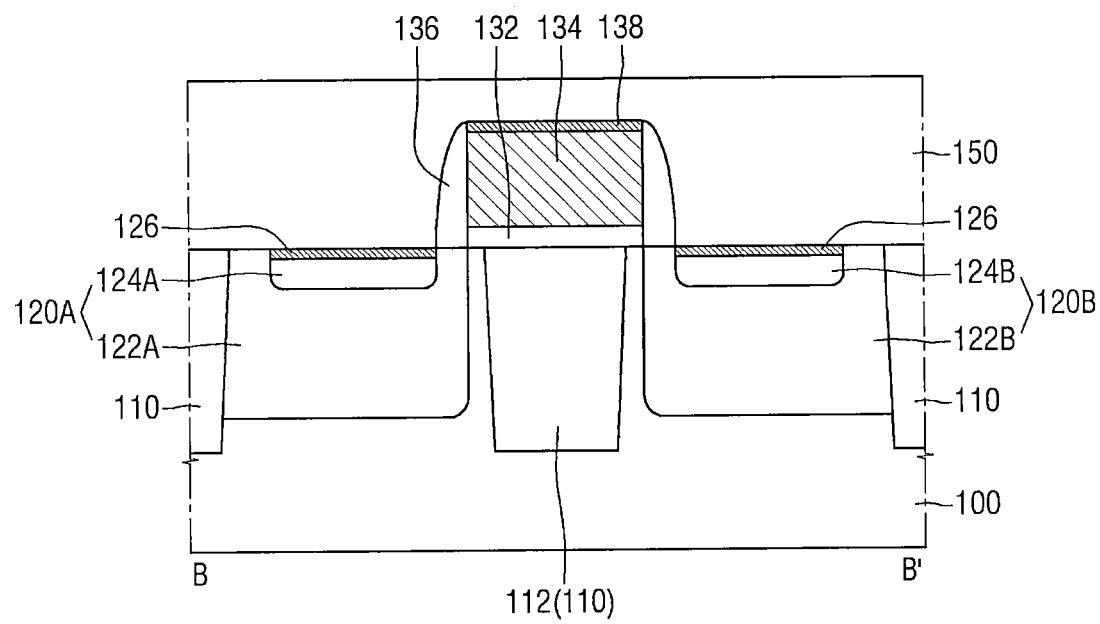
FIG. 3 is a cross-sectional view taken along line B-B' of FIG. 1.
Figure 4:
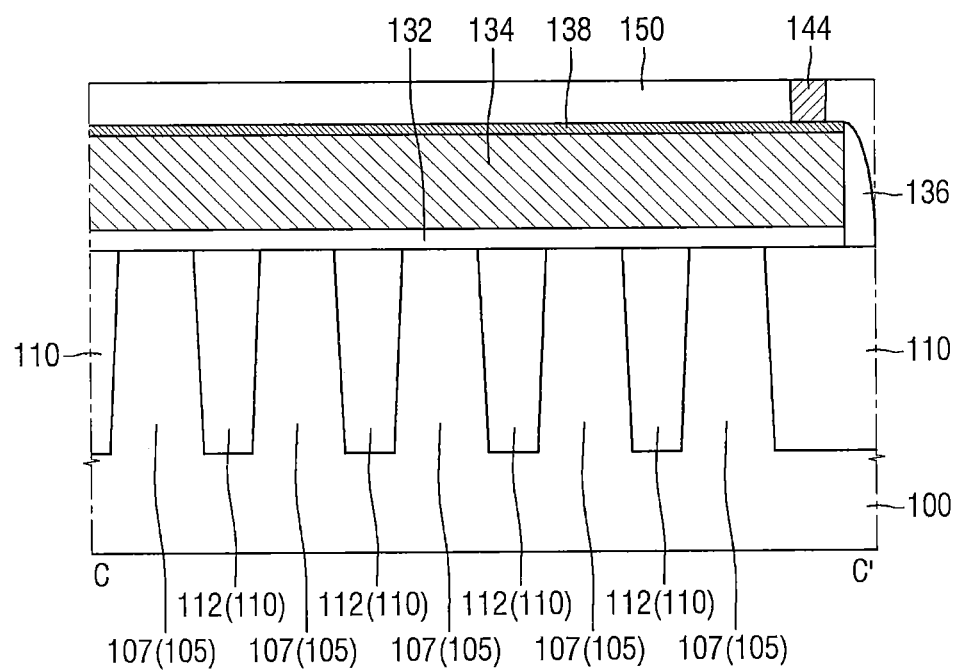
FIG. 4 is a cross-sectional view taken along line C-C' of FIG. 1.

FIG. 1 is a layout diagram of a semiconductor device according to some embodiments of the present inventive concepts. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1.

Referring to FIGS. 1 to 4, the semiconductor device according to some embodiments may include a substrate 100, a device isolation layer 110, a gate dielectric layer 132, a first gate electrode 134, a gate spacer 136, an interlayer insulating layer 150, at least one first contact 142 and at least one second contact 144.

The substrate 100 may include, but is not limited to, a base substrate and an epilayer grown on the base substrate. For example, the substrate 100 may include only an epilayer without the base substrate. The substrate 100 may be a silicon substrate, a gallium arsenide substrate, a silicon germanium substrate, a ceramic substrate, a quartz substrate, a display glass substrate, or the like, and may be a source (semiconductor on insulator) substrate. Hereinafter, the substrate 100 is illustrated as a silicon substrate as an example.

In some embodiments, the substrate 100 may be doped with a first conductivity type. For example, when the semiconductor device according to some embodiments is an n-type transistor, the substrate 100 may be doped with a p-type impurity. Although it is not illustrated, the substrate 100 may include a well doped with the first conductivity type.

The device isolation layer 110 may define an active region 105 in the substrate 100. In FIGS. 2 to 4, the side wall of the device isolation layer 110 is illustrated to have an inclination, but this is merely a feature in the process of forming the device isolation layer 110, and the present disclosure is not limited thereto.

The device isolation layer 110 may include an insulating material. For example, the device isolation layer 110 may include, but is not limited to, at least one of silicon oxide, silicon nitride, or combinations thereof.

The gate dielectric layer 132 may be formed on the substrate 100. For example, the gate dielectric layer 132 may be formed on the active region 105 and the device isolation layer 110. The gate dielectric layer 132 may extend in a first direction Y1.

The gate dielectric layer 132 may include, for example, silicon oxide, silicon oxynitride, silicon nitride, and/or a high dielectric material having a dielectric constant higher than silicon oxide. The high dielectric material may include, but is not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The semiconductor device according to some embodiments may be a high-voltage transistor. For example, the semiconductor device according to some embodiments may include, but is not limited to, a thick gate dielectric layer 132 with a thickness of 200 Å or higher.

The first gate electrode 134 may be formed on the gate dielectric layer 132. Further, the first gate electrode 134 may extend in the first direction Y1. As a result, the gate dielectric layer 132 may be interposed between the active region 105 and the first gate electrode 134.

The first gate electrode 134 may include a conductive material. For example, the first gate electrode 134 may be formed of a material selected from the group consisting of polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al), tungsten (W), or combinations thereof. Hereinafter, the first gate electrode 134 will be described as including polycrystalline silicon.

The semiconductor device according to some embodiments may be a high-voltage transistor. For example, a voltage of 5V to 100V may be applied to the first gate electrode 134, but the present disclosure is not limited thereto.

The gate spacer 136 may be formed on both side walls of the gate dielectric layer 132 and on both side walls of the first gate electrode 134. Like the gate dielectric layer 132 and the first gate electrode 134, the gate spacer 136 may extend in the first direction Y1. The gate dielectric layer 132 and the first gate electrode 134 may fill a trench defined by an upper surface of the substrate 100 and an inner side wall of the gate spacer 136.

In some embodiments, the gate dielectric layer 132 may not be interposed between the first gate electrode 134 and the gate spacer 136. For example, the gate dielectric layer 132 may not extend along the side walls of the gate spacer 136, and/or the gate spacer 136 may not extend along side walls of the gate dielectric layer 132.

The substrate 100 may include an active region 105 defined by the device isolation layer 110. For example, the active region 105 may include a first source/drain region 120A and a second source/drain region 120B formed on each of both side walls of the first gate electrode 134.

The first source/drain region 120A may be formed in the active region 105 on one side of the first gate electrode 134. The first source/drain region 120A may be doped with a second conductivity type. For example, when the semiconductor device according to some embodiments is an n-type transistor, the first source/drain region 120A may be doped with the n-type impurity.

The first source/drain region 120A may include a first low-concentration impurity region 122A and a first high-concentration impurity region 124A. The first high-concentration impurity region 124A may be formed in the first low-concentration impurity region 122A. Further, the first low-concentration impurity region 122A may at least partly surround the first high-concentration impurity region 124A.

The first low-concentration impurity region 122A and the first high-concentration impurity region 124A may be on a first side of the first gate electrode 134. The first low-concentration impurity region 122A may be adjacent to a plane defined by a side wall of the first gate electrode 134, and the first high-concentration impurity region 124A may be adjacent to a plane defined by a side wall of the gate spacer 136. As a result, the first low-concentration impurity region 122A may be at least partly interposed between the first high-concentration impurity region 124A, and the first gate electrode 134 or a region of the substrate 100 therebelow. In some embodiments, the first high-concentration impurity region 124A may be spaced apart from the first gate electrode 134 by the thickness of the gate spacer 136.

The first low-concentration impurity region 122A and the first high-concentration impurity region 124A may be doped with the second conductivity type. However, the doping concentration of the first high-concentration impurity region 124A may be higher than the doping concentration of the first low-concentration impurity region 122A. In other words, the terms "low-concentration" and "high-concentration" are to be understood as relative terms to one another.

The second source/drain region 120B may be formed in the active region 105 on the other side of the first gate electrode 134. The second source/drain region 120B may be doped with the second conductivity type. For example, when the semiconductor device according to some embodiments is the n-type transistor, the second source/drain region 120B may be doped with the n-type impurity.

The second source/drain region 120B may include a second low-concentration impurity region 122B and a second high-concentration impurity region 124B. The second high-concentration impurity region 124B may be formed in the second low-concentration impurity region 122B. That is, the second low-concentration impurity region 122B may at least partly surround the second high-concentration impurity region 124B.

The second low-concentration impurity region 122B and the second high-concentration impurity region 124B may be on a second side of the first gate electrode 134 that is opposite from the first side. The second low-concentration impurity region 122B may be adjacent to a plane defined by a side wall of the first gate electrode 134, and the second high-concentration impurity region 124B may be adjacent to a plane defined by a portion of the gate spacer 136 that is. Therefore, the second low-concentration impurity region 122B may be interposed between the second high-concentration impurity region 124B and the first gate electrode 134.

In some embodiments, the second high-concentration impurity region 124B may be spaced apart from the first gate electrode 134 by the thickness of the gate spacer 136.

The second low-concentration impurity region 122B and the second high-concentration impurity region 124B may be doped with the second conductivity type. However, the doping concentration of the second high-concentration impurity region 124B may be higher than the doping concentration of the second low-concentration impurity region 122B.

The first source/drain region 120A and the second source/drain region 120B may extend in the first direction Y1. The first high-concentration impurity region 124A and the second high-concentration impurity region 124B may also extend in the first direction Y1. As a result, the first source/drain region 120A and the second source/drain region 120B may extend alongside the first gate electrode 134 with the first gate electrode 134 interposed therebetween. Further, the first source/drain region 120A, the first gate electrode 134, and the second source/drain region 120B may be sequentially arranged along a second direction X1 intersecting the first direction Y1, as best seen in FIG. 2.

In some embodiments, the first source/drain region 120A and the second source/drain region 120B may be formed at the same level. In the present specification, the term "the same level" may include formation by the same fabricating process. The first low-concentration impurity region 122A and the second low-concentration impurity region 122B may contain substantially the same material, but the present disclosure is not limited thereto. Further, the first high-concentration impurity region 124A and the second high-concentration impurity region 124B may contain substantially the same material, but again the present disclosure is not limited thereto.

The active region 105 may include a plurality of first connecting sections 107 which connect the first source/drain region 120A and the second source/drain region 120B. The plurality of first connecting sections 107 may be spaced from each other by the device isolation layer 110. For example, the device isolation layer 110 may include a plurality of first separating sections 112 which separate the plurality of first connecting sections 107 from each other in the active region 105. The first connecting section 107 and the first separating section 112 will be described later in detail with reference to FIGS. 5 and 6.

The interlayer insulating layer 150 may be formed on the substrate 100. For example, the interlayer insulating layer 150 may cover the active region 105, the device isolation layer 110, the first gate electrode 134, and the gate spacer 136.

The interlayer insulating layer 150 may include, for example, at least one of silicon oxide, silicon nitride, silicon oxynitride and a low dielectric constant (low-k) material having a dielectric constant lower than that of silicon oxide. The low dielectric constant material may include, but is not limited to, for example, at least one of FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or combinations thereof.

The at least one first contact 142 may be formed on the first source/drain region 120A and the second source/drain region 120B. As illustrated in FIG. 2, the at least one first contact 142 may penetrate the interlayer insulating layer 150, or may extend at least partially into the interlayer insulating layer 150. The at least one first contact 142 may be electrically connected to the first source/drain region 120A and the second source/drain region 120B.

In FIG. 1, five first contacts 142 are illustrated as being formed on the first source/drain region 120A and the second source/drain region 120B, respectively, but the present disclosure is not limited thereto. For example, four or less or six or more first contacts 142 may be formed on the first source/drain region 120A and the second source/drain region 120B, respectively. Also, for example, different numbers of first contacts 142 may be formed on the first source/drain region 120A and the second source/drain region 120B.

In some embodiments, the semiconductor device may further include a first silicide layer 126. The first silicide layer 126 may be formed on the first and second source/drain regions 120A and 120B. For example, the first contact 142 may be in direct contact with the first silicide layer 126.

The first silicide layer 126 may include metal silicide. For example, the first silicide layer 126 may include at least one of titanium silicide, tantalum silicide, tungsten silicide, nickel silicide, cobalt silicide, or combinations thereof.

The second contact 144 may be formed on the first gate electrode 134. For example, as illustrated in FIG. 4, the second contact 144 may penetrate through the interlayer insulating layer 150 and may be electrically connected to the first gate electrode 134.

In FIG. 1, one second contact 144 is illustrated, but the present disclosure is not limited thereto. For example, if necessary, two or more second contact 144 may be formed.

The semiconductor device according to some embodiments may further include a second silicide layer 138. The second silicide layer 138 may be formed on the first gate electrode 134. For example, the second contact 144 may be in direct contact with the second silicide layer 138.

The second silicide layer 138 may include metal silicide. For example, the second silicide layer 138 may include at least one of titanium silicide, tantalum silicide, tungsten silicide, nickel silicide, cobalt silicide, or combinations thereof.

In some embodiments, the first silicide layer 126 and the second silicide layer 138 may be formed at the same level. The first silicide layer 126 and the second silicide layer 138 may include substantially the same material.

Hereinafter, the active region 105 of FIG. 1 will be described in more detail with reference to FIGS. 1 to 7.

Figure 5:
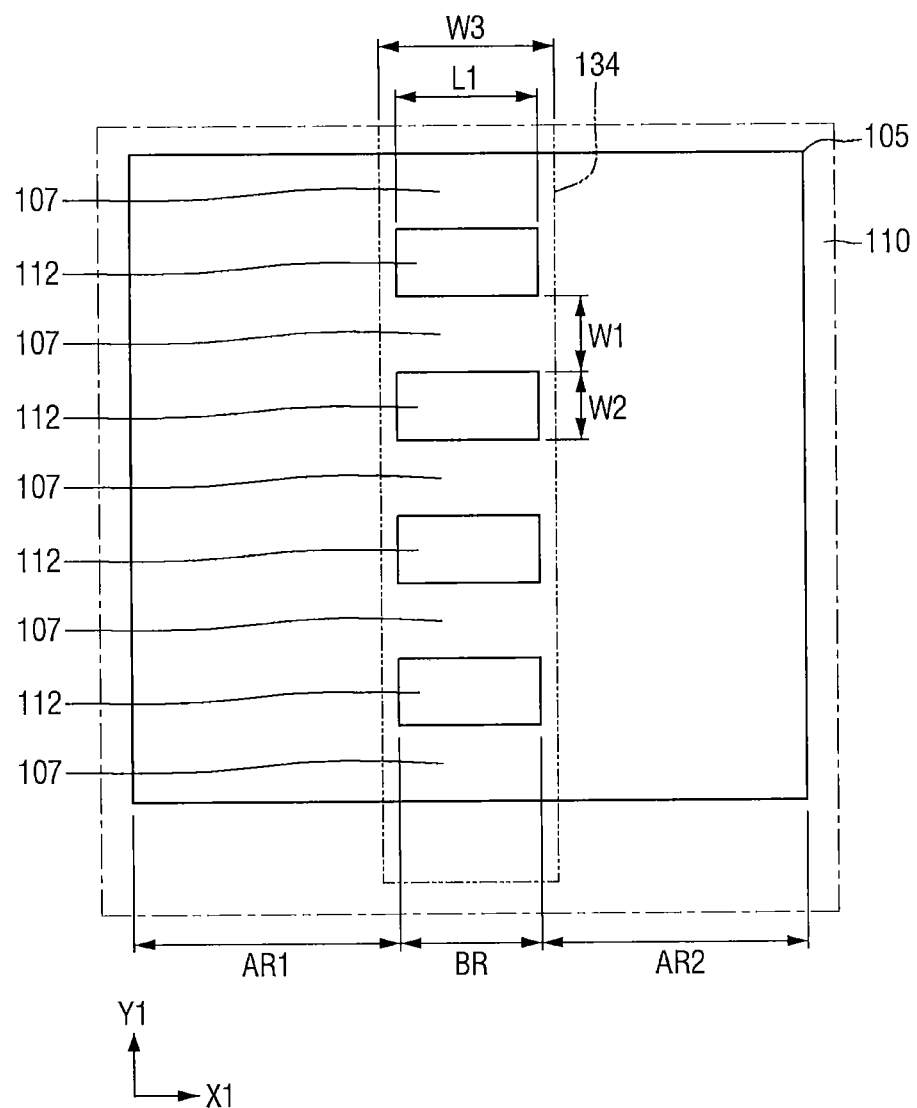
FIGS. 5 and 6 are diagrams for explaining the active region of FIG. 1.
Figure 6:
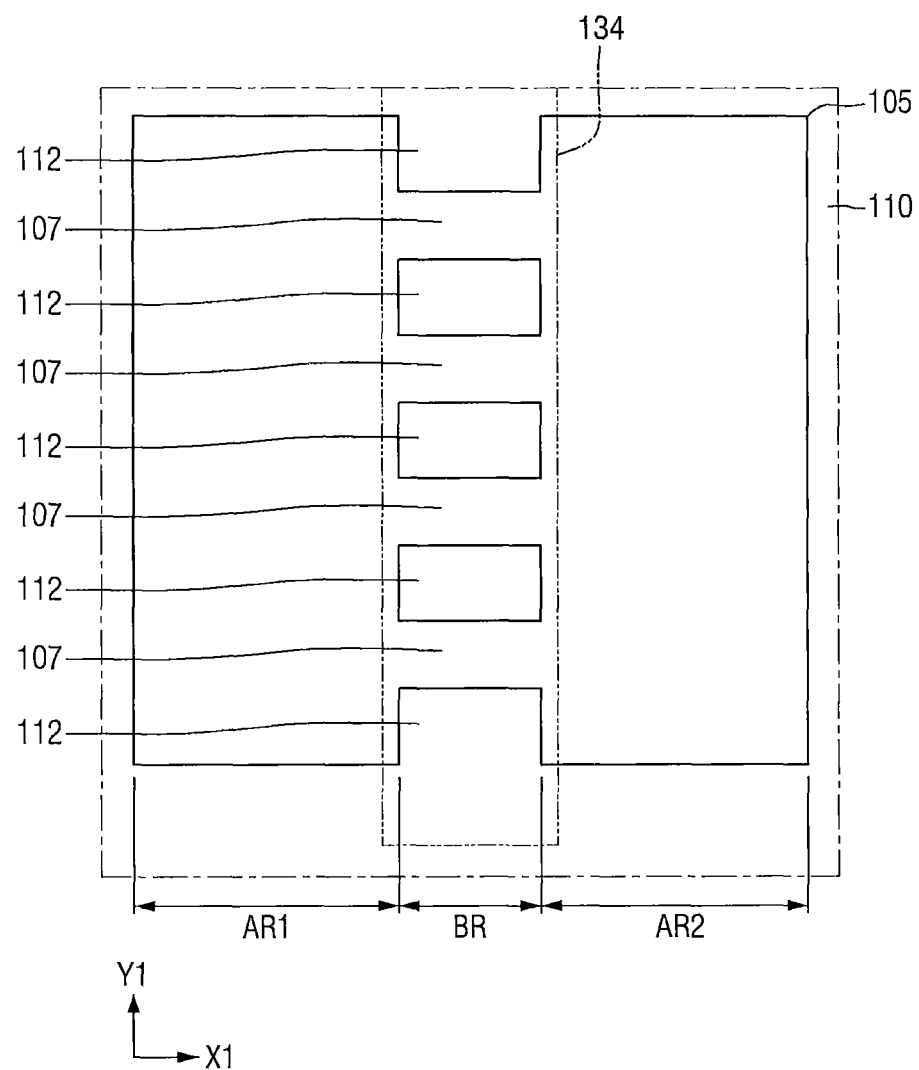
Figure 7:
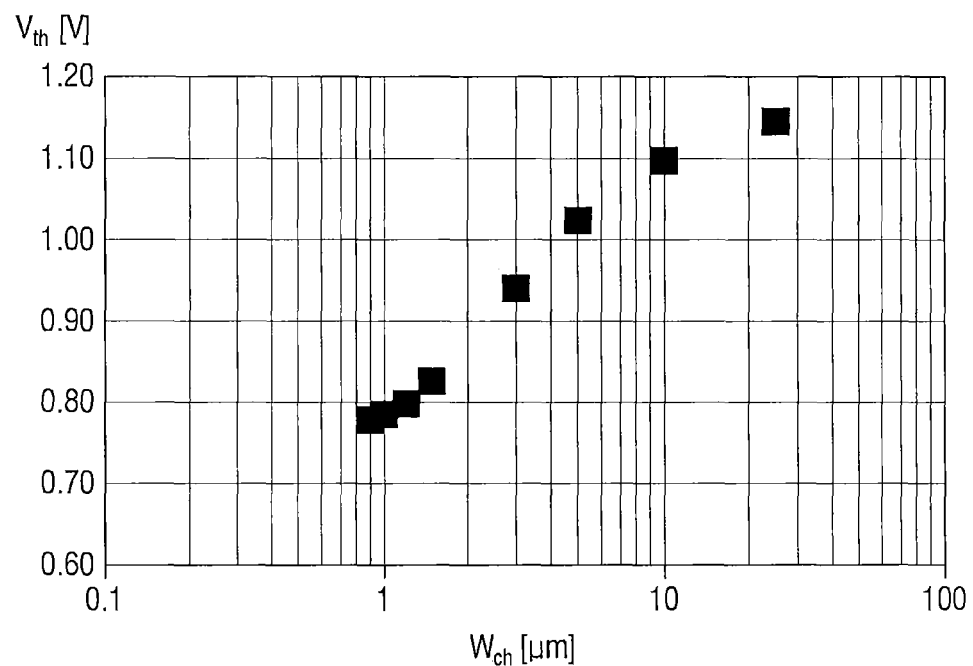
FIG. 7 is a graph for explaining a change in threshold voltage depending on a channel width of the semiconductor device according to some embodiments.

FIGS. 5 and 6 are diagrams for explaining the active region of FIG. 1. FIG. 7 is a graph for explaining a change in threshold voltage depending on a channel width of the semiconductor device according to some embodiments. For the sake of convenience of explanation, repeated parts of description provided referring to FIGS. 1 to 4 may be either briefly described or omitted in favor of the description provided previously.

Referring to FIGS. 5 and 6, the active region 105 includes a first active region AR1, a second active region AR2 and a bridge region BR each extending in the first direction Y1.

The bridge region BR may be interposed between the first active region AR1 and the second active region AR2. For example, the first active region AR1, the bridge region BR, and the second active region AR2 may be arranged in order along the second direction X1.

The first active region AR1 may be a region in which the first source/drain region 120A is formed, and the second active region AR2 may be a region in which the second source/drain region 120B is formed.

A plurality of first connecting sections 107 may be formed in the bridge region BR. The plurality of first connecting sections 107 may be arranged along the first direction Y1. Each of the first connecting sections 107 may connect the first active region AR1 and the second active region AR2.

For example, each of the first connecting sections 107 may extend in the second direction X1 and may connect the first active region AR1 and the second active region AR2. As a result, each of the first connecting sections 107 may connect the first source/drain region 120A and the second source/drain region 120B. Further, each of the first connecting sections 107 may have a shape protruding from the first source/drain region 120A and the second source/drain region 120B and extending in the second direction X1. In some embodiments, each first connecting section 107 may directly connect the first low-concentration impurity region 122A with the second low-concentration impurity region 122B.

The plurality of first connecting sections 107 may be spaced apart from each other by the device isolation layer 110. For example, the device isolation layer 110 may include a plurality of first separating sections 112 which separates the plurality of first connecting sections 107 from each other in the active region 105. The plurality of first separating sections 112 may be arranged along the first direction Y1. That is, the plurality of first connecting sections 107 and the plurality of first separating sections 112 may be alternately arranged along the first direction Y1.

In FIG. 5, the number of the first connecting sections 107 is illustrated as being larger than the number of the first separating sections 112, but the present disclosure is not limited thereto. For example, as illustrated in FIG. 6, the number of the first separating sections 112 may be larger than the number of the first connecting sections 107. Alternatively, for example, the number of the first separating sections 112 may be the same as the number of the first connecting sections 107.

The plurality of first connecting sections 107 and the plurality of first separating sections 112 may be formed under the first gate electrode 134. Specifically, the first gate electrode 134 may be formed to overlap the plurality of first connecting sections 107 and the plurality of first separating sections 112. Herein, the term "overlap" may be defined as an overlap in a direction perpendicular to the upper surface of the substrate 100. For example, as illustrated in FIGS. 5 and 6, and with reference to FIGS. 2 and 3, the first gate electrode 134 may extend in the first direction Y1 over the plurality of first connecting sections 107 and the plurality of first separating sections 112. Thus, the plurality of first connecting sections 107 may configure a channel of the transistor.

In some embodiments, a first width W1 of each first connecting section 107 may be about 10 μm or less. The first width W1 represents a width of each first connecting section 107 in the first direction Y1. In a case where the first width W1 of each first connecting section 107 is about 10 μm or less, a threshold voltage of the high-voltage transistor may be adjusted. For example, when a high voltage (for example, a voltage of 5V to 100V) is applied to the first gate electrode 134 and the first width W1 is 10 μm or less, the semiconductor device according to some embodiments may provide a reduced threshold voltage.

In some embodiments, a second width W2 of each first separating section 112 may be determined by the process capability of the fabricating process of the semiconductor device. The second width W2 represents the width of each of the first separating sections 112 in the first direction Y1. As the second width W2 decreases, the number of the first connecting sections 107 may increase. Thus, the current characteristics of the semiconductor device according to some embodiments may be improved. For example, the second width W2 of each first separating section 112 may be from about 0.1 μm to about 1 μm.

In some embodiments, a third width W3 of the first gate electrode 134 may be different from a first length L1 of each first connecting section 107 and/or of each first separating section 112. The third width W3 represents a width of the first gate electrode 134 in the second direction X1. The first length L1 represents a length of each first connecting section 107, and/or a length of each first separating section 112, in the second direction X1. For example, as illustrated in FIG. 5, the third width W3 may be greater than the first length L1. Therefore, in some embodiments, the plurality of first connecting sections 107 and the plurality of first separating sections 112 may be completely covered by the first gate electrode 134.

Referring to FIG. 7, it may be seen that the threshold voltage decreases with the decrease in the channel width in the semiconductor device according to some embodiments.

FIG. 7 illustrates measurement results of the threshold voltage of the high-voltage transistor which changes depending on the channel width of the high-voltage transistor. The horizontal axis of FIG. 7 represents a channel width Wch of the high-voltage transistor to be measured. For example, the horizontal axis of FIG. 7 may mean the first width W1 of each first connecting section 107 of FIGS. 1 to 6. The vertical axis of FIG. 7 represents a threshold voltage Vth of the high-voltage transistor to be measured. The vertical axis of FIG. 7 is a measurement of a linear threshold voltage of a high-voltage transistor that changes depending on the channel width Wch.

As illustrated in FIG. 7, the threshold voltage Vth of the high-voltage transistor decreases in the channel width Wch of about 10 μm or less. This may be due to the influence of a parasitic transistor generated in the high-voltage transistor. For example, in the high-voltage transistor structure, parasitic transistors may be formed in the channel width direction due to the low doping concentration of the channel. The influence of the parasitic transistor may increase as the channel width decreases and may consequently cause a drop in the threshold voltage.

A semiconductor device according to some embodiments may configure a channel of the transistor, using the first connecting section or sections 107 defined by the device isolation layer 110 in the bridge region BR. For example, the first width W1 of each first connecting section 107 may be about 10 μm or less. Therefore, a semiconductor device with the adjusted threshold voltage may be provided.

Further, the semiconductor device according to some embodiments may configure a channel of the transistor, using the plurality of first connecting sections 107. For example, the current characteristic of the semiconductor device may be improved as the number of the first connecting sections 107 increases. Therefore, a semiconductor device with the adjusted threshold voltage and having desirable current characteristics may be provided.

Further, the semiconductor device according to some embodiments may configure a channel of the transistor, using the first connecting section 107 defined by the size of the first separating section 112. That is, the first width W1 of the first connecting section 107 may be defined by the device isolation layer 110 formed in the bridge region BR. Therefore, a semiconductor device with the threshold voltage adjusted by a simplified process may be provided.

Figure 8:
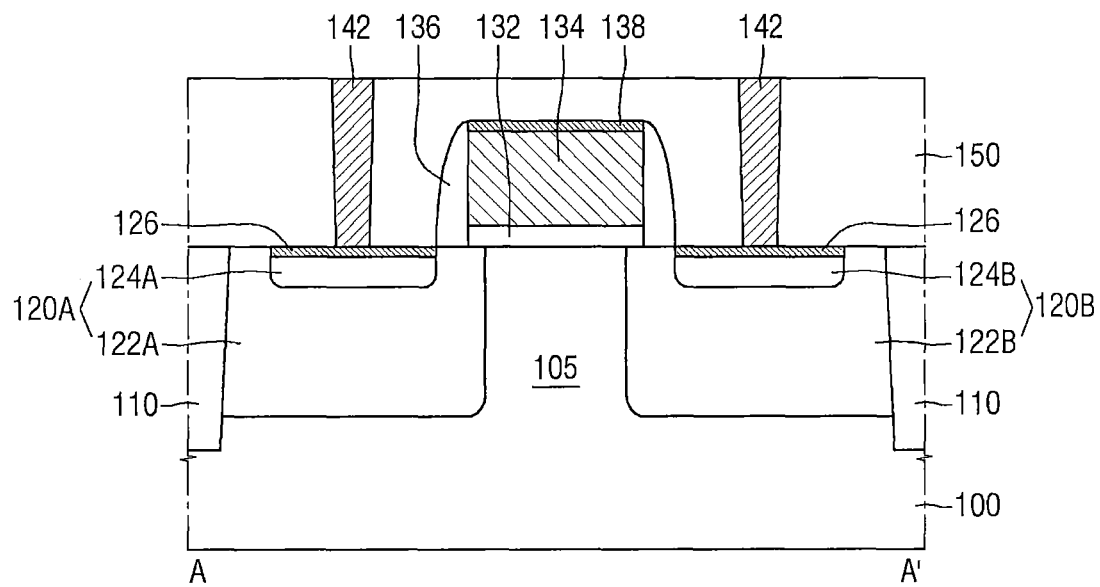
FIG. 8 is a cross-sectional view illustrating a semiconductor device according to some embodiments of the present inventive concepts.

FIG. 8 is a cross-sectional view illustrating a semiconductor device according to some embodiments of the present inventive concepts. For the sake of convenience of explanation, repeated parts of description provided referring to FIGS. 1 to 7 may be briefly explained or omitted in favor of the previously provided description.

Referring to FIG. 8, in the semiconductor device according to some embodiments, a portion or portions of the first gate electrode 134 may at least partially overlap a part of the first low-concentration impurity region 122A and a part of the second low-concentration impurity region 122B. Herein, the term "overlap" may be defined as an overlap in a direction perpendicular to the upper surface of the substrate 100.

The first low-concentration impurity region 122A and the second low-concentration impurity region 122B may be formed by, for example, an ion implantation process. For example, impurities implanted into the first low-concentration impurity region 122A and the second low-concentration impurity region 122B may be diffused, and the first low-concentration impurity region 122A and the second low-concentration impurity region 122B which are at least partially overlapped by the first gate electrode 134 may be formed.

Alternatively, for example, the first low-concentration impurity region 122A and the second low-concentration impurity region 122B may be formed in the active region 105 before the first gate electrode 134 is formed. Subsequently, the first gate electrode 134 that at least partially overlaps a part of the first low-concentration impurity region 122A and a part of the second low-concentration impurity region 122B may be formed.

Figure 9:
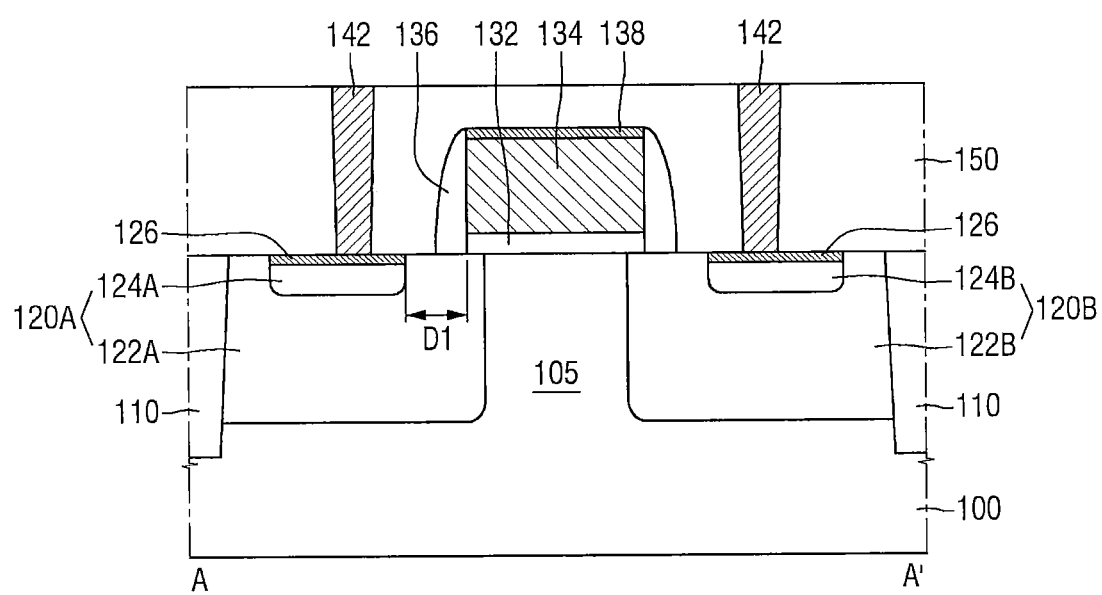
FIG. 9 is a cross-sectional view illustrating a semiconductor device according to some embodiments of the present inventive concepts.

FIG. 9 is a cross-sectional view illustrating a semiconductor device according to some embodiments of the present inventive concepts. For the sake of convenience of explanation, parts of description provided referring to FIGS. 1 to 8 may be briefly described or omitted in favor of the previously provided description.

Referring to FIG. 9, in the semiconductor device according to some embodiments, the first high-concentration impurity region 124A and the second high-concentration impurity region 124B may be spaced apart from the gate spacer 136 in the second direction X1.

For example, the first high-concentration impurity region 124A may be spaced apart from the first gate electrode 134 by a first distance D1. The first distance D1 may be greater than the thickness of the gate spacer 136. Here, the "thickness" may be defined as a thickness in the second direction X1. As a result, the first high-concentration impurity region 124A may be spaced apart from not only the first gate electrode 134 but also the gate spacer 136.

In some embodiments, the spacing of the first high-concentration impurity region 124A and the second high-concentration impurity region 124B from the gate spacer 136 by the first distance D1 may prevent punchthrough and leakage current between the source region and the drain region of the transistor, and may be kept to improve the breakdown voltage characteristics.

Figure 10:
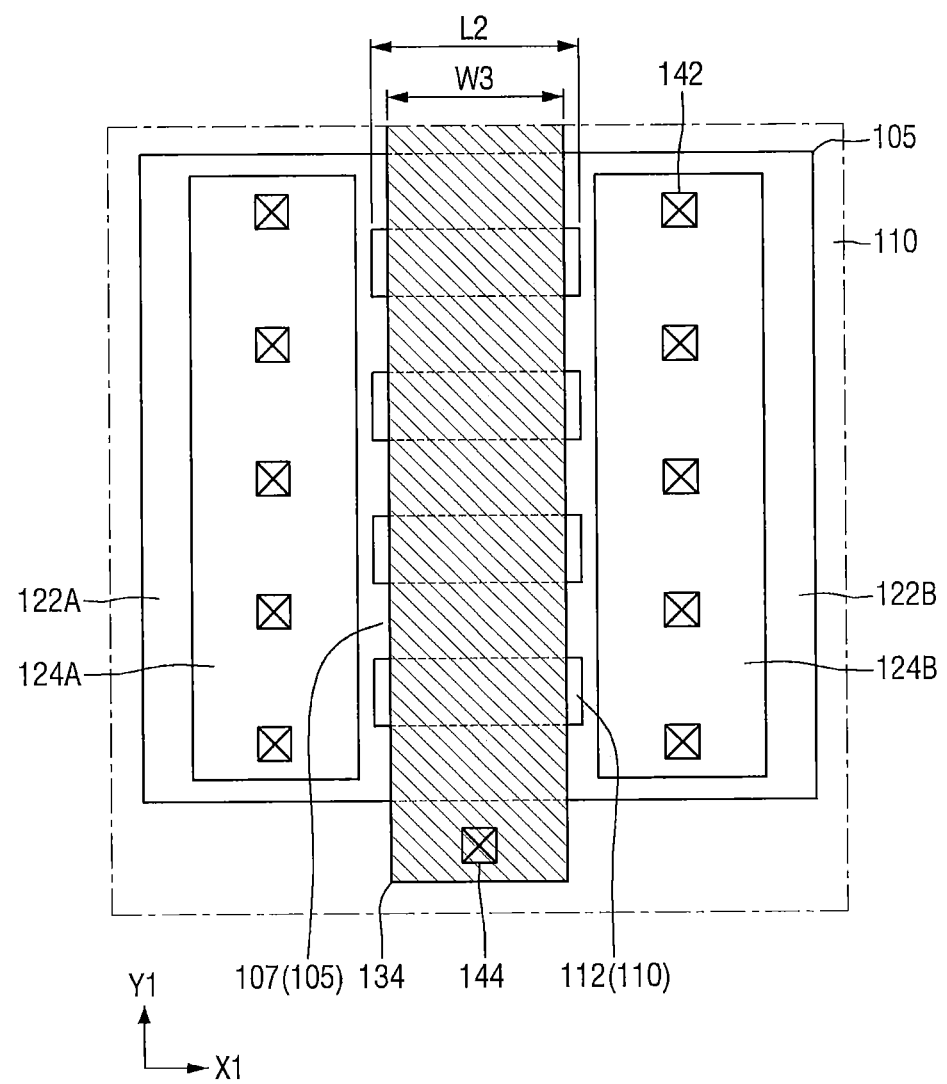
FIG. 10 is a layout diagram for explaining a semiconductor device according to some embodiments of the present inventive concepts.

FIG. 10 is a layout diagram for explaining a semiconductor device according to some embodiments of the present inventive concepts. For the sake of convenience of explanation, repeated parts of description provided referring to FIGS. 1 to 7 may be briefly explained or omitted in favor of the previously provided description.

Referring to FIG. 10, in the semiconductor device according to some embodiments, a third width W3 of the first gate electrode 134 may be smaller than the second length L2 of each first connecting section 107 and/or of the each first separating section 112.

The third width W3 represents a width of the first gate electrode 134 in the second direction X1. The second length L2 represents a length of each first connecting section 107 in the second direction X1 and/or a length of each first separating section 112. For example, the third width W3 may be smaller than the second length L2. Thus, in some embodiments, a part of each first connecting section 107 and a part of each first separating section 112 may not be overlapped by the first gate electrode 134, and may therefore be exposed.

In some embodiments, a part of each first connecting section 107 may include a first low-concentration impurity region 122A and a second low-concentration impurity region 122B. For example, as described above with reference to FIGS. 1 to 4, the first low-concentration impurity region 122A may be adjacent to the side wall of the first gate electrode 134. Thus, in some embodiments, a part of each first connecting section 107 not overlapped by the first gate electrode 134 may be doped with the second conductivity type.

Figure 11:
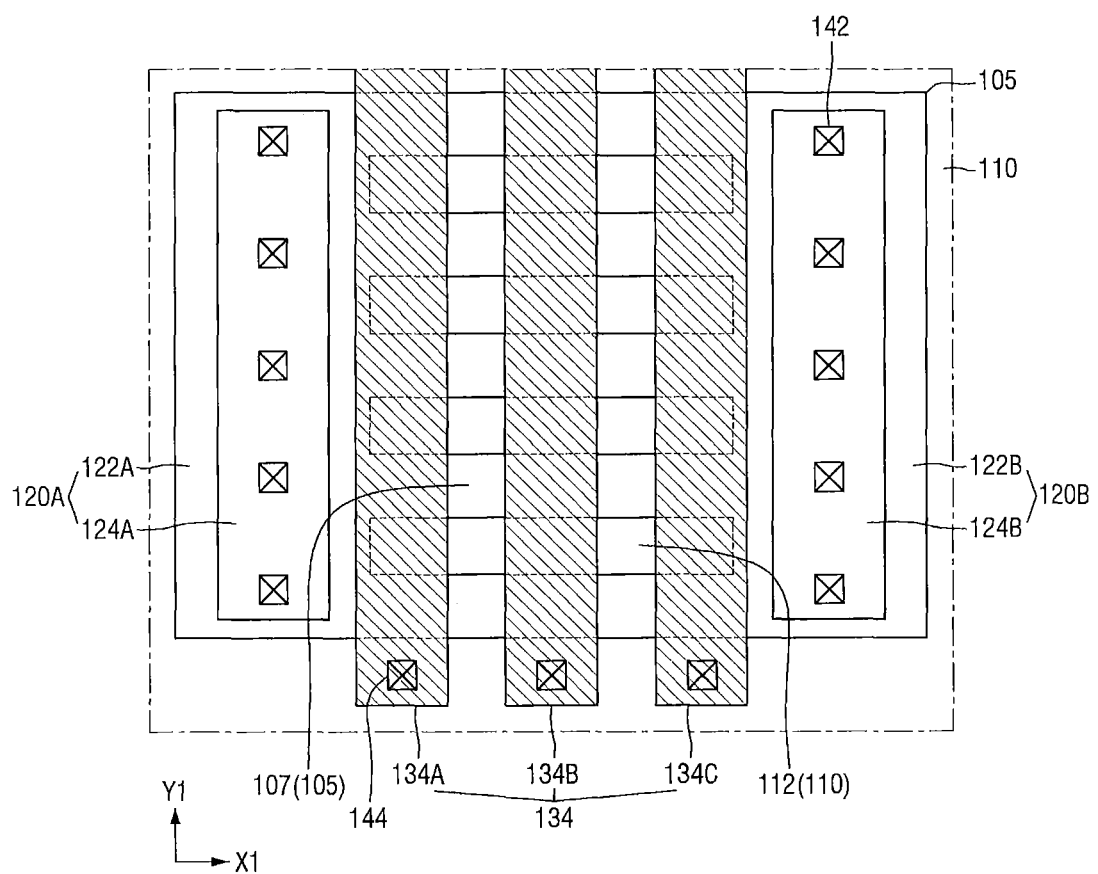
FIG. 11 is a layout diagram for explaining a semiconductor device according to some embodiments of the present inventive concepts.

FIG. 11 is a layout diagram for explaining a semiconductor device according to some embodiments of the present inventive concepts. For the sake of convenience of explanation, repeated parts of description provided referring to FIGS. 1 to 7 will be briefly explained or omitted in favor of the previously provided description.

Referring to FIG. 11, in the semiconductor device according to some embodiments, a first gate electrode 134 may include a plurality of conductive patterns. In FIG. 11, only three conductive patterns are illustrated, but the present disclosure is not limited thereto. If desired, the first gate electrode 134 may include two or more conductive patterns.

For example, the first gate electrode 134 may include a first conductive pattern 134A, a second conductive pattern 134B, and a third conductive pattern 134C. The first conductive pattern 134A, the second conductive pattern 134B, and the third conductive pattern 134C may extend in the first direction Y1. Further, the first conductive pattern 134A, the second conductive pattern 134B, and the third conductive pattern 134C may be sequentially arranged along the second direction X1.

In some embodiments, the same voltage may be applied to the first conductive pattern 134A, the second conductive pattern 134B and the third conductive pattern 134C. However, the present disclosure is not limited thereto, and different voltages may be applied to the first conductive pattern 134A, the second conductive pattern 134B and the third conductive pattern 134C.

In some embodiments, at least some parts of the first conductive pattern 134A, the second conductive pattern 134B, and the third conductive pattern 134C may be a dummy conductive pattern. For example, a voltage may be applied to the second conductive pattern 134B, and no voltage may be applied to the first conductive pattern 134A and the third conductive pattern 134C.

Figure 12:
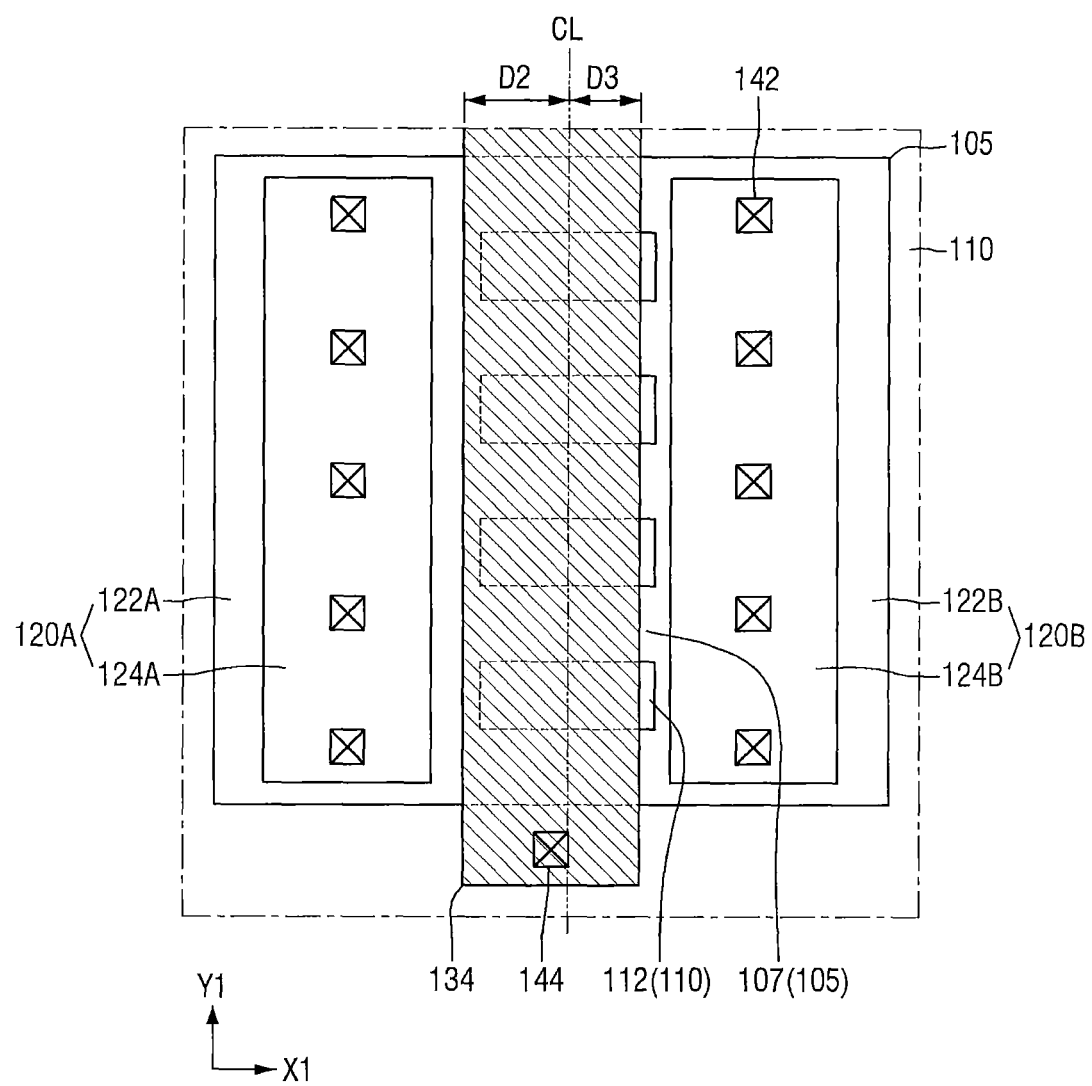
FIG. 12 is a layout diagram for explaining a semiconductor device according to some embodiments of the present inventive concepts.

FIG. 12 is a layout diagram for explaining a semiconductor device according to some embodiments of the present inventive concepts. For the sake of convenience of explanation, repeated parts of description provided referring to FIGS. 1 to 7 may be briefly explained or omitted in favor of the previously provided description.

Referring to FIG. 12, in the semiconductor device according to some embodiments, the first gate electrode 134 may be asymmetrical with respect to the respective first connecting sections 107.

For example, as illustrated, a center line CL extending in the first direction Y1 may be defined. The center line CL may pass through the center of each first connecting section 107 and/or of each first separating section 112 and. As illustrated in FIG. 12, a second distance D2 from the center line CL to one side of the first gate electrode 134 may be different from a third distance D3 from the center line CL to the other side of the first gate electrode 134.

In some embodiments, a semiconductor device in which the second distance D2 or the third distance D3 is adjusted and the threshold voltage or the current characteristics are adjusted may be provided.

Figure 13:
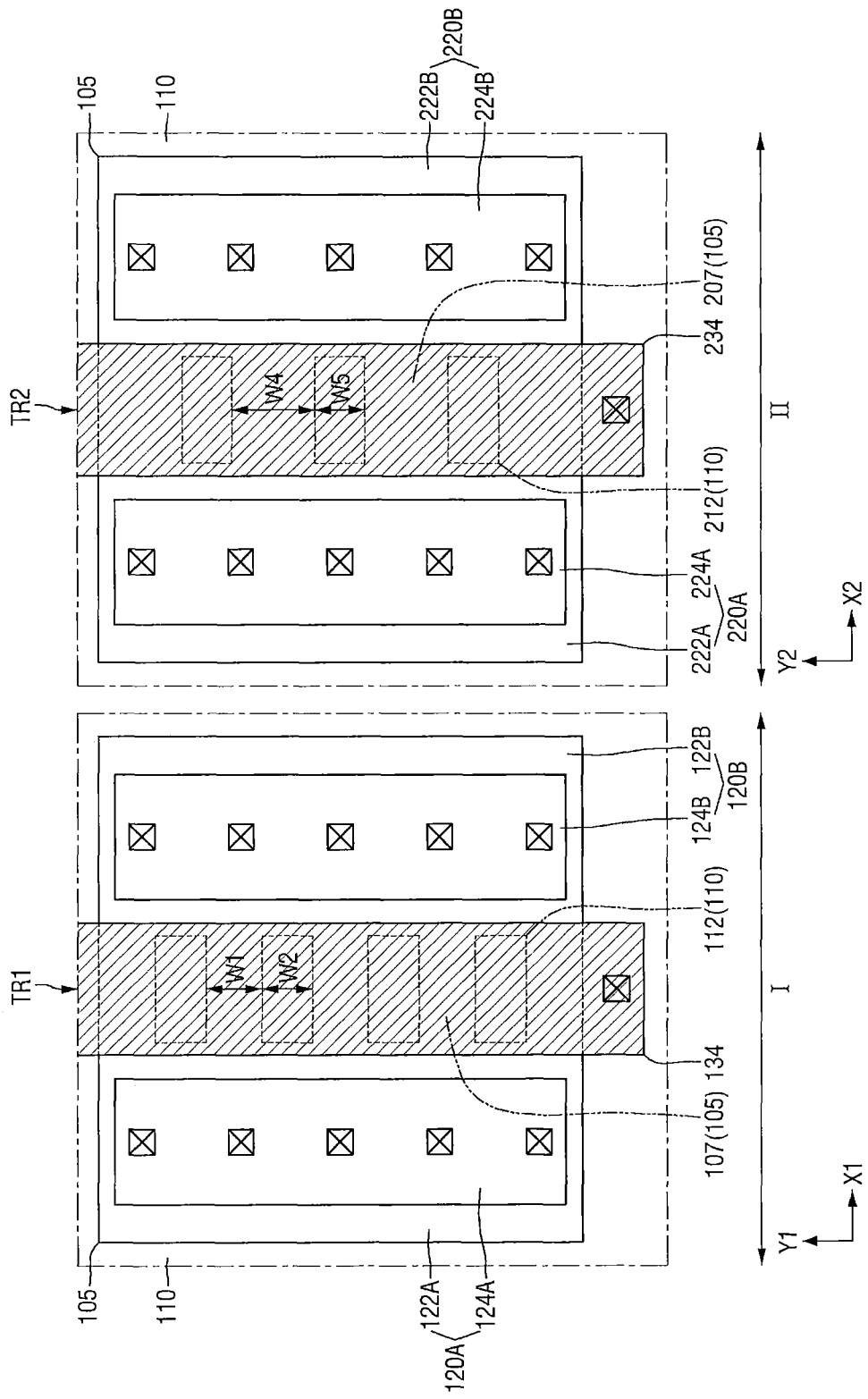
FIG. 13 is a layout diagram for explaining a semiconductor device according to some embodiments of the present inventive concepts.
Figure 14:
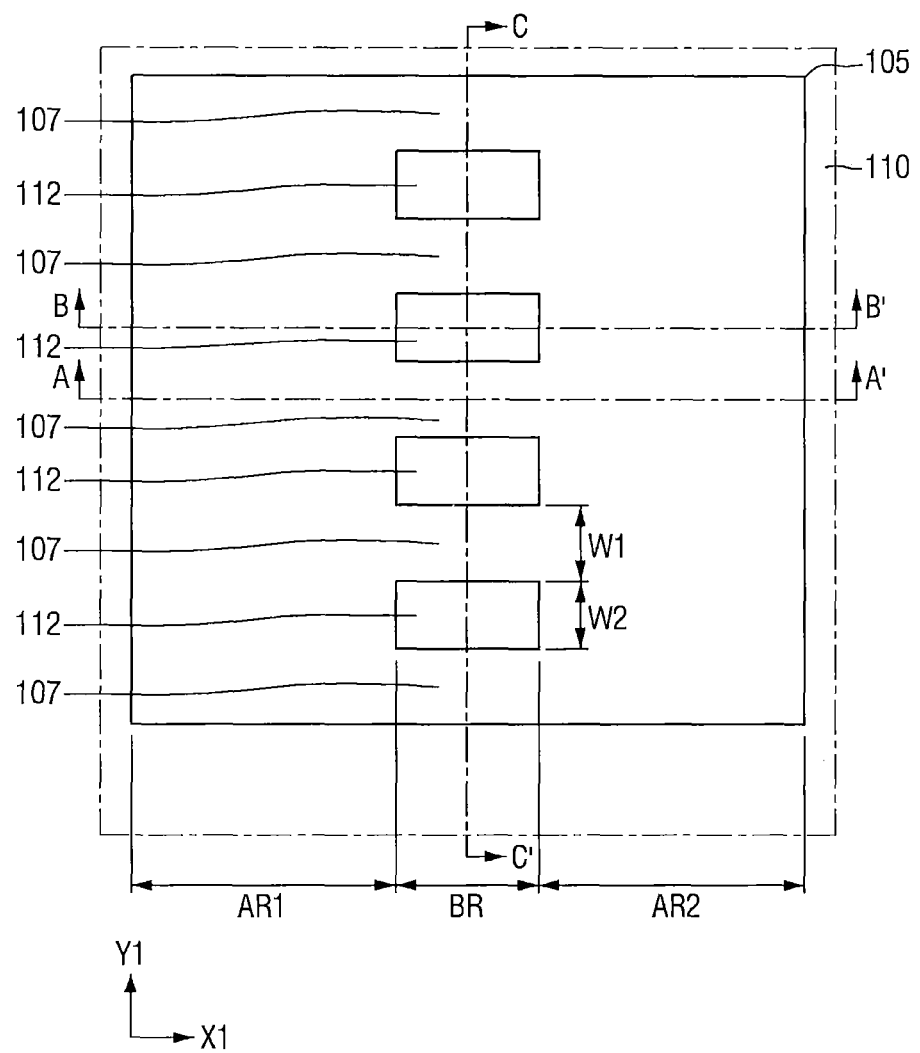
FIGS. 14 to 25 are intermediate step diagrams for explaining a method for fabricating a semiconductor device according to some embodiments of the present inventive concepts.

FIG. 13 is a layout diagram for explaining a semiconductor device according to some embodiments of the present inventive concepts. For the sake of convenience of explanation, repeated parts of description provided referring to FIGS. 1 to 7 may be briefly explained or omitted in favor of the previously provided description.

Referring to FIG. 13, the semiconductor device according to some embodiments includes a first transistor TR1 and a second transistor TR2 on the substrate 100.

The substrate 100 may include a first region I and a second region II. The first region I and the second region II may be regions that are spaced apart from each other, and may be regions that are connected to each other. The first transistor TR1 may be formed on the first region I, and the second transistor TR2 may be formed on the second region II.

In some embodiments, the first transistor TR1 and the second transistor TR2 may be transistors of the same conductivity type. For example, both the first transistor TR1 and the second transistor TR2 may be the transistors of the second conductivity type. For example, both the first transistor TR1 and the second transistor TR2 may be the n-type transistors.

The first transistor TR1 may be substantially the same as the semiconductor device described with reference to FIGS. 1 to 4, and as such the detailed description thereof will be omitted here in favor of the previously provided description.

The second transistor TR2 may include a second gate electrode 234.

The second gate electrode 234 may extend in a third direction Y2. The third direction Y2 is illustrated as being the same as the first direction Y1, but the present disclosure is not limited thereto, and the third direction Y2 may be different from the first direction Y1.

In some embodiments, the first gate electrode 134 and the second gate electrode 234 may be formed at the same level. The second gate electrode 234 may include substantially the same material as the first gate electrode 134.

In some embodiments, the first transistor TR1 and the second transistor TR2 may be high-voltage transistors. For example, a voltage of 5V to 100V may be applied to the first gate electrode 134 and the second gate electrode 234, but the present disclosure is not limited thereto.

The second region II of the substrate 100 may include an active region 105 defined by the device isolation layer 110. For example, the active region 105 of the second region II may include a third source/drain region 220A and a fourth source/drain region 220B each formed on respective sides of the second gate electrode 234.

The third source/drain region 220A may be formed in the active region 105 on one side of the second gate electrode 234. In some embodiments, the third source/drain region 220A may be doped with the second conductivity type. For example, when the second transistor TR2 is an n-type transistor, the third source/drain region 220A may be doped with the n-type impurity.

The third source/drain region 220A may include a third low-concentration impurity region 222A and a third high-concentration impurity region 224A. The third high-concentration impurity region 224A may be formed in the third low-concentration impurity region 222A. Further, the third low-concentration impurity region 222A may at least partly surround the third high-concentration impurity region 224A. In some embodiments, at least a portion of the third low-concentration impurity region 222A may be interposed between the third high-concentration impurity region 224A and the second gate electrode 234.

The third low-concentration impurity region 222A and the third high-concentration impurity region 224A may be doped with the second conductivity type. However, the doping concentration of the third high-concentration impurity region 224A may be higher than the doping concentration of the third low-concentration impurity region 222A.

The fourth source/drain region 220B may be formed in the active region 105 on the other side of the second gate electrode 234. In some embodiments, the fourth source/drain region 220B may be doped with the second conductivity type. For example, when the second transistor TR2 is the n-type transistor, the fourth source/drain region 220B may be doped with the n-type impurity.

The fourth source/drain region 220B may include a fourth low-concentration impurity region 222B and a fourth high-concentration impurity region 224B. The fourth high-concentration impurity region 224B may be formed in the fourth low-concentration impurity region 222B. That is, the fourth low-concentration impurity region 222B may at least partly surround the fourth high-concentration impurity region 224B. In some embodiments, at least a portion of the fourth low-concentration impurity region 222B may be interposed between the fourth high-concentration impurity region 224B and the second gate electrode 234.

The fourth low-concentration impurity region 222B and the fourth high-concentration impurity region 224B may be doped with the second conductivity type. However, the doping concentration of the fourth high-concentration impurity region 224B may be higher than the doping concentration of the fourth low-concentration impurity region 222B.

The third source/drain region 220A and the fourth source/drain region 220B may extend in the third direction Y2. Further the third high-concentration impurity region 224A and the fourth high-concentration impurity region 224B may extend in the third direction Y2. The third source/drain region 220A, the second gate electrode 234 and the fourth source/drain region 220B may be sequentially arranged along a fourth direction X2 that intersects with the third direction Y2.

The active region 105 of the second region II may include a plurality of second connecting sections 207 which connects the third source/drain region 220A and the fourth source/drain region 220B. The plurality of second connecting sections 207 may be spaced apart from each other by the device isolation layer 110. For example, the device isolation layer 110 may include a plurality of second separating sections 212 that separate the plurality of second connecting sections 207 from each other in the active region 105 of the second region II. The second connecting section 207 and the second separating section 212 may be similar to the first connecting section 107 and the first separating section 112 described above in the description of FIGS. 5 and 6, the detailed description thereof will be omitted here in favor of the previously provided description.

In some embodiments, the first width W1 of each first connecting section 107 may be different from a fourth width W4 of each second connecting section 207. The fourth width W4 represents the width of each second connecting section 207 in the third direction Y2. In such a case, a first threshold voltage of the first transistor TR1 may be different from a second threshold voltage of the second transistor TR2. For example, as illustrated, the first width W1 may be smaller than the fourth width W4. In such a case, the first threshold voltage of the first transistor TR1 may be lower than the second threshold voltage of the second transistor TR2.

In some embodiments, both the first width W1 and the fourth width W4 may be about 10 μm or less.

In some embodiments, the second width W2 of each first separating section 112 and a fifth width W5 of each second separating section 212 may be the same or substantially the same. The fifth width W5 represents a width of each second separating section 212 in the third direction Y2. For example, the second width W2 and the fifth width W5 may be determined by the process capability of the fabricating process of the semiconductor device. For example, the second width W2 and the fifth width W5 may be the same, and between about 0.1 μm and about 1 μm.

Hereinafter, a method for fabricating a semiconductor device according to some embodiments of the present inventive concepts will be described with reference to FIGS. 1 to 26.

FIGS. 14 to 25 are intermediate step diagrams for explaining the method for fabricating a semiconductor device according to some embodiments of the present inventive concepts. For the sake of convenience of explanation, the repeated parts of description provided referring to FIGS. 1 to 13 may be briefly explained or omitted in favor of the previously provided description.

Figure 15:
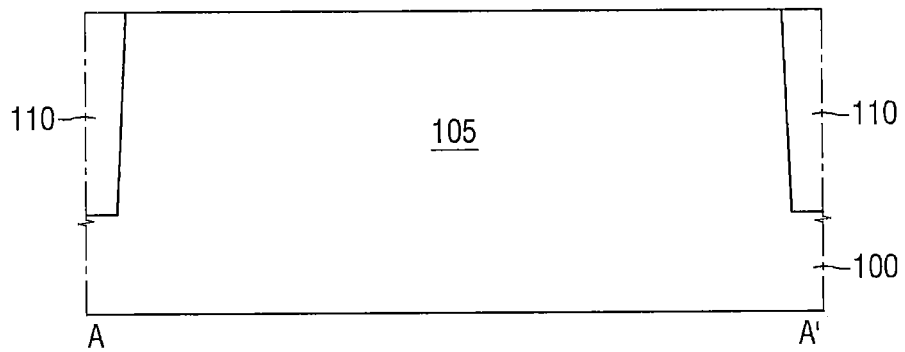
Figure 16:
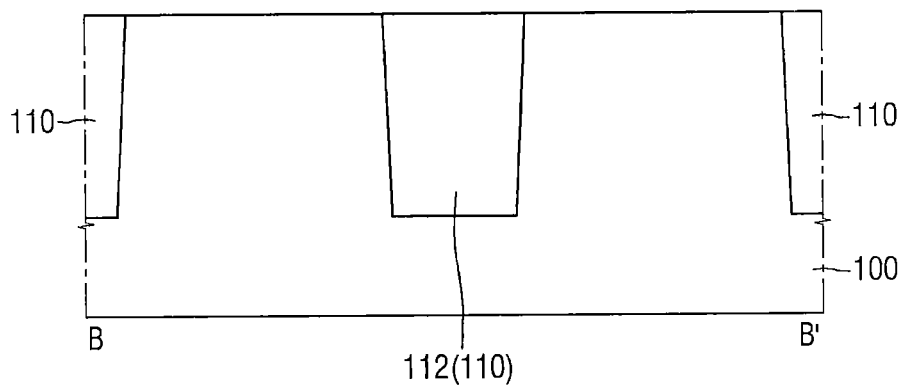
Figure 17:
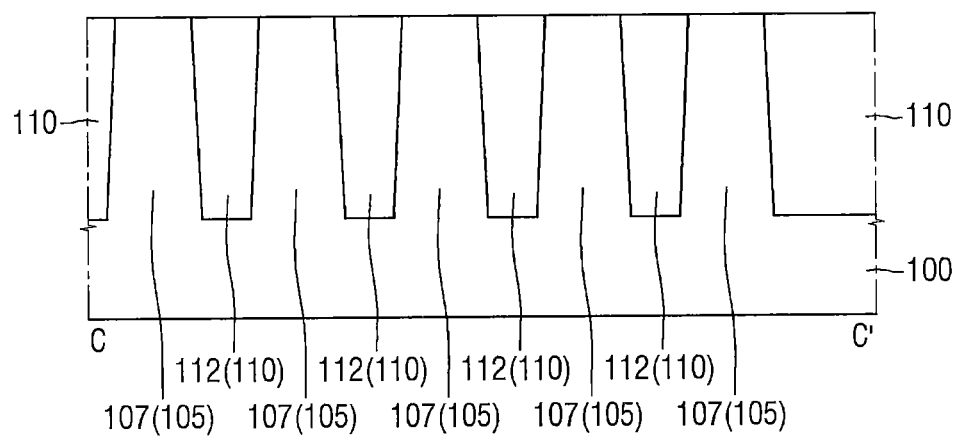
Figure 18:
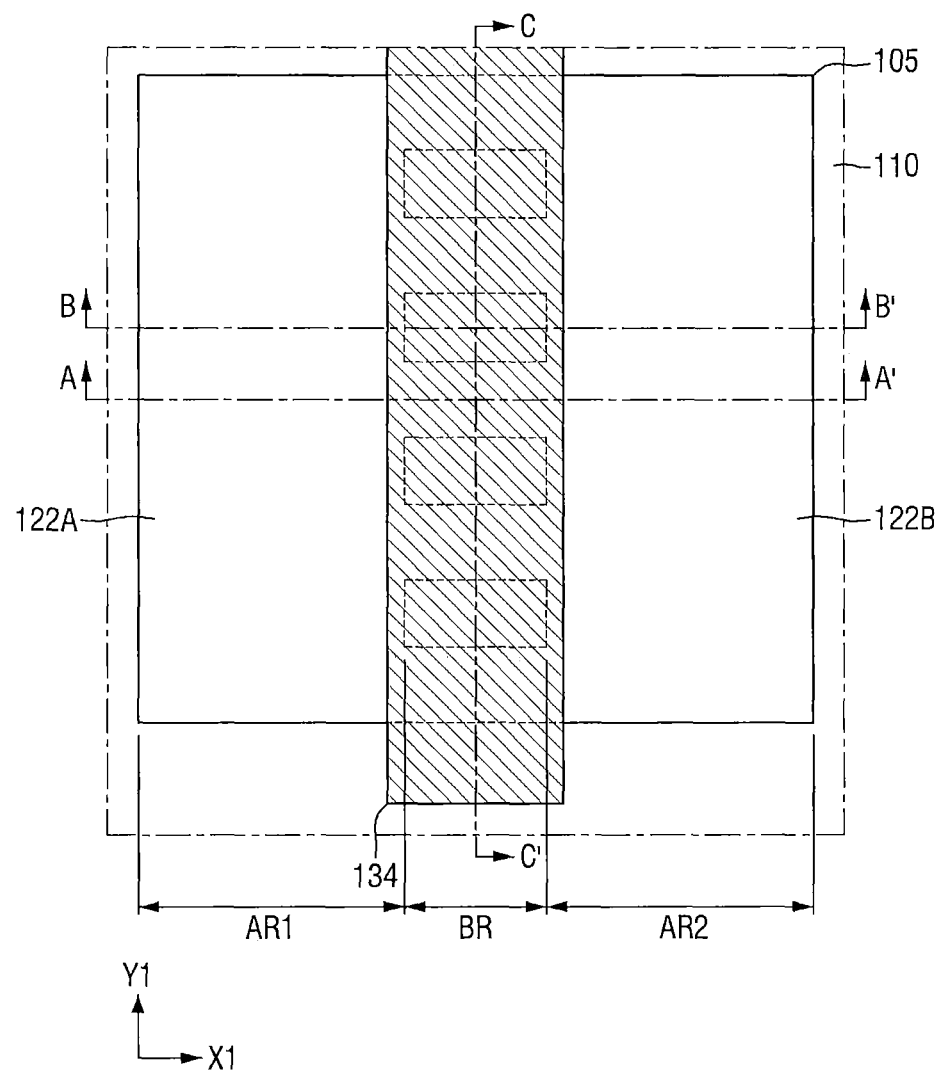

Referring to FIGS. 14 to 17, the device isolation layer 110 may be formed in the substrate 100. For reference, FIG. 15 is a cross-sectional view taken along line A-A' of FIG. 14. FIG. 16 is a cross-sectional view taken along line B-B' of FIG. 14. FIG. 17 is a cross-sectional view taken along line C-C' of FIG. 14.

For example, a trench for defining an active region 105 may be formed in the substrate 100. Subsequently, an insulating material for filling the trench may be formed. Thus, the device isolation layer 110 for defining the active region 105 may be formed.

In some embodiments, the substrate 100 may be doped with the first conductivity type. For example, when the semiconductor device according to some embodiments is an n-type transistor, the substrate 100 may be doped with a p-type impurity. Although it is not illustrated, the substrate 100 may also include a well doped with the first conductivity type.

The device isolation layer 110 may be formed to include a plurality of first separating sections 112. The plurality of first separating sections 112 may be formed to be arranged along the first direction Y1 in the bridge region BR. Thus, a plurality of first connecting sections 107 spaced apart from each other by the device isolation layer 110 may be formed in the bridge region BR. The plurality of first connecting sections 107 and the plurality of first separating sections 112 may be alternately arranged along the first direction Y1.

In some embodiments, the first width W1 of each first connecting section 107 may be formed to a predetermined size. For example, the size or the number of the plurality of first separating sections 112 may be adjusted. As a result, an active region 105 in which the first width W1 of each first connecting section 107 is adjusted may be formed.

Figure 19:
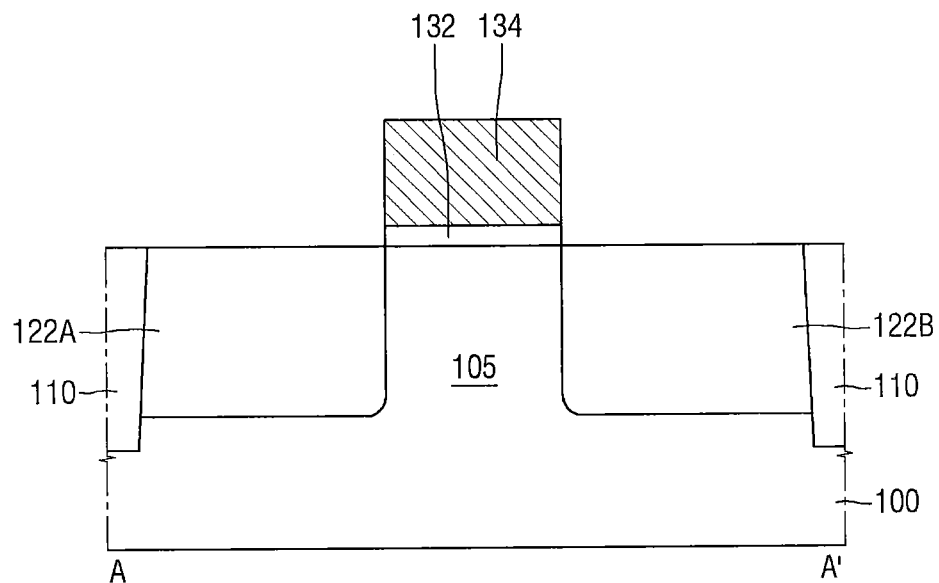
Figure 20:
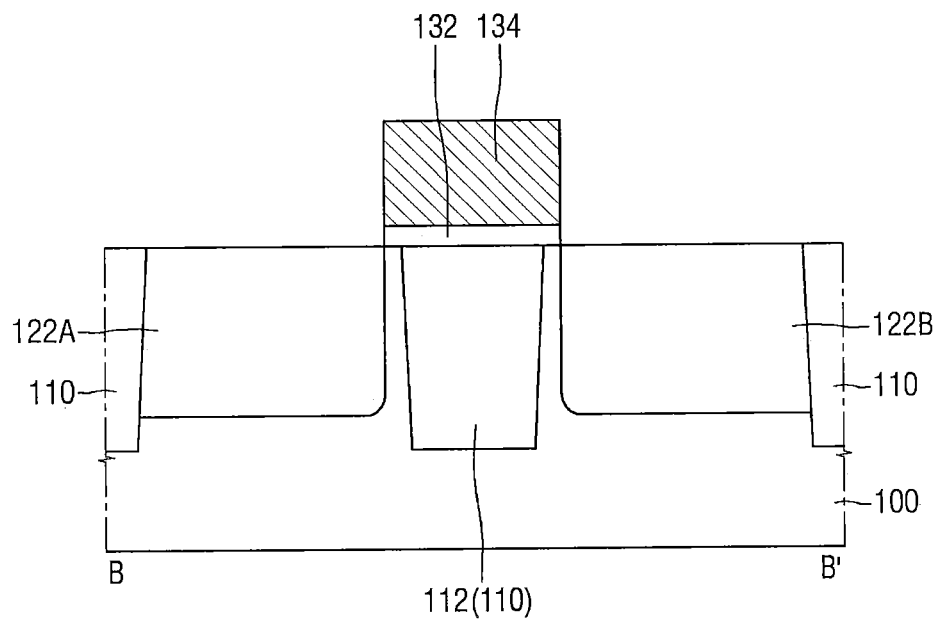
Figure 21:
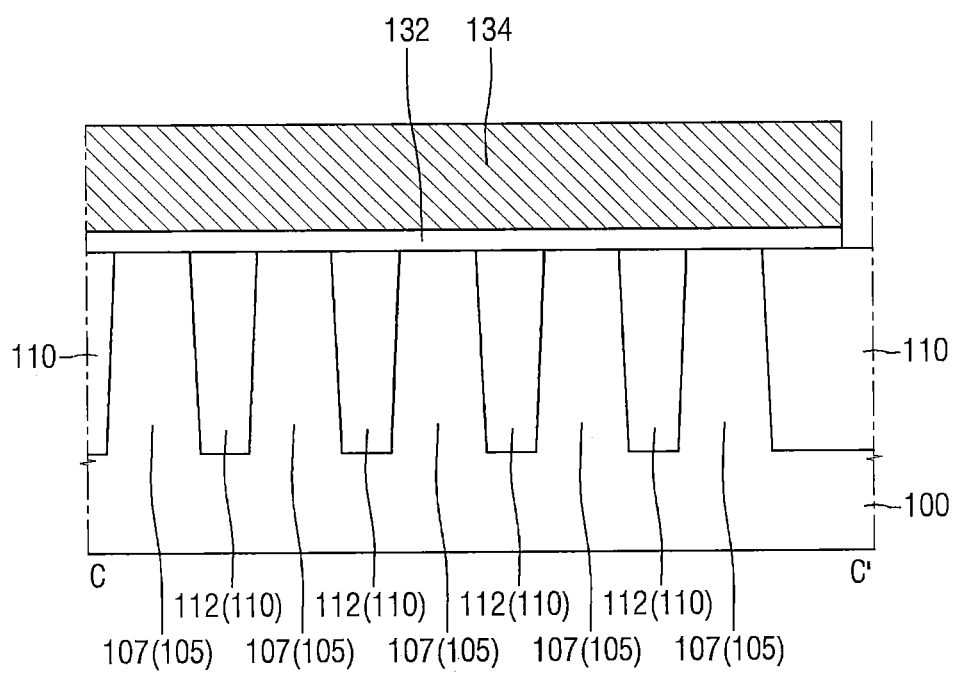
Figure 22:
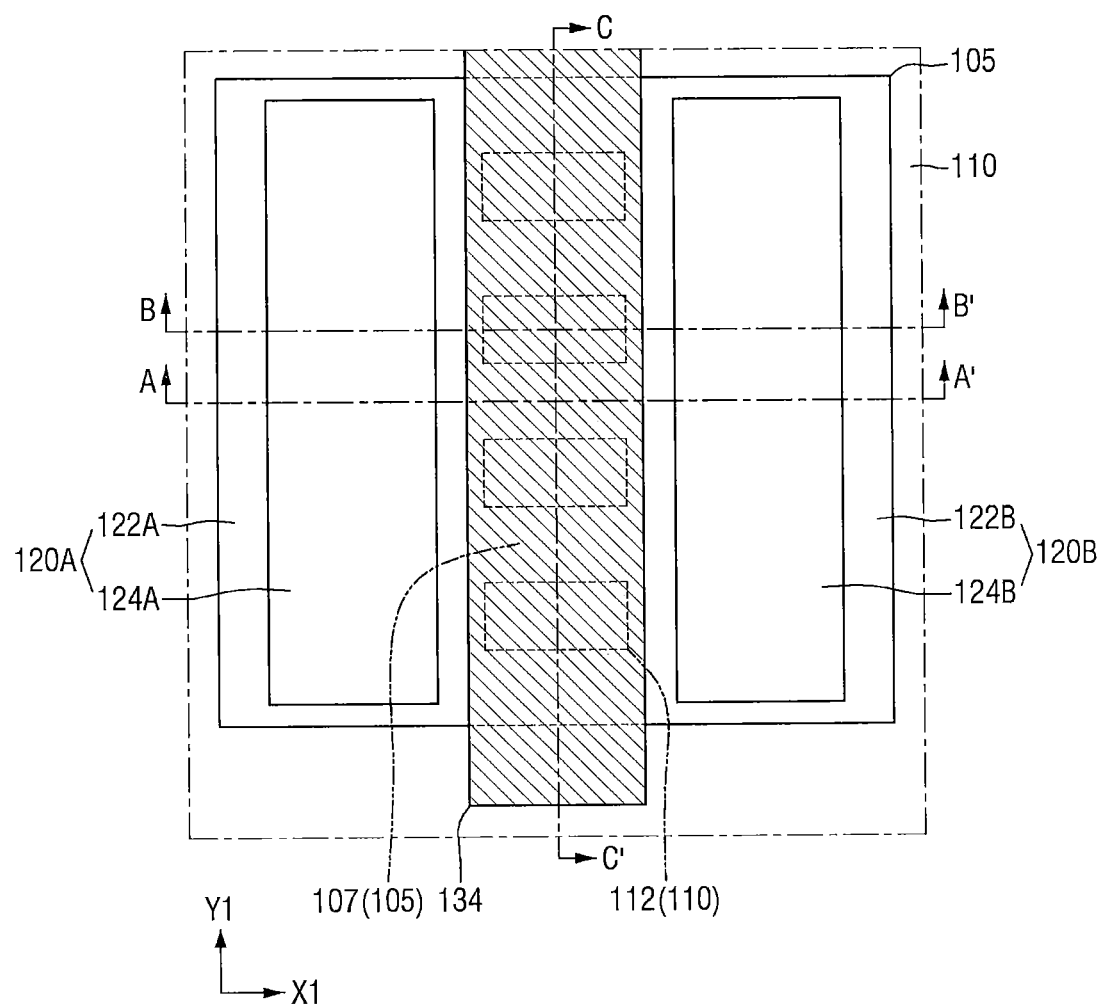

Referring to FIGS. 18 to 21, the gate dielectric layer 132 and the first gate electrode 134 may be formed on the substrate 100. Subsequently, the first low-concentration impurity region 122A and the second low-concentration impurity region 122B may be formed in the substrate 100. For reference, FIG. 19 is a cross-sectional view taken along line A-A' of FIG. 18. FIG. 20 is a cross-sectional view taken along line B-B' of FIG. 18. FIG. 21 is a cross-sectional view taken along line C-C' of FIG. 18.

For example, a dielectric film and a conductive film may be sequentially formed on the substrate 100. Next, the dielectric film and the conductive layer may be patterned to form the gate dielectric layer 132 and the first gate electrode 134 extending in the first direction Y1.

Subsequently, the first low-concentration impurity region 122A and the second low-concentration impurity region 122B may be formed in the active region 105. The first low-concentration impurity region 122A and the second low-concentration impurity region 122B may be formed by doping impurities into the substrate 100. For example, an ion implantation process which uses the first gate electrode 134 as a mask may be performed.

The first low-concentration impurity region 122A and the second low-concentration impurity region 122B may be doped with a second conductivity type. For example, when the semiconductor device according to some embodiments is an n-type transistor, the first low-concentration impurity region 122A and the second low-concentration impurity region 122B may be doped with the n-type impurity.

Figure 23:
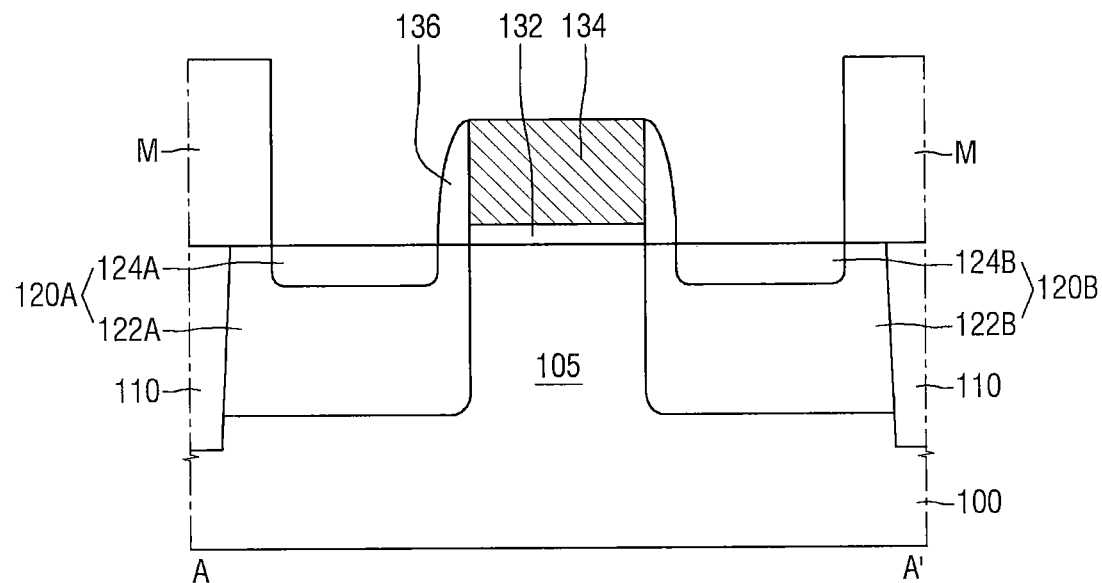
Figure 24:
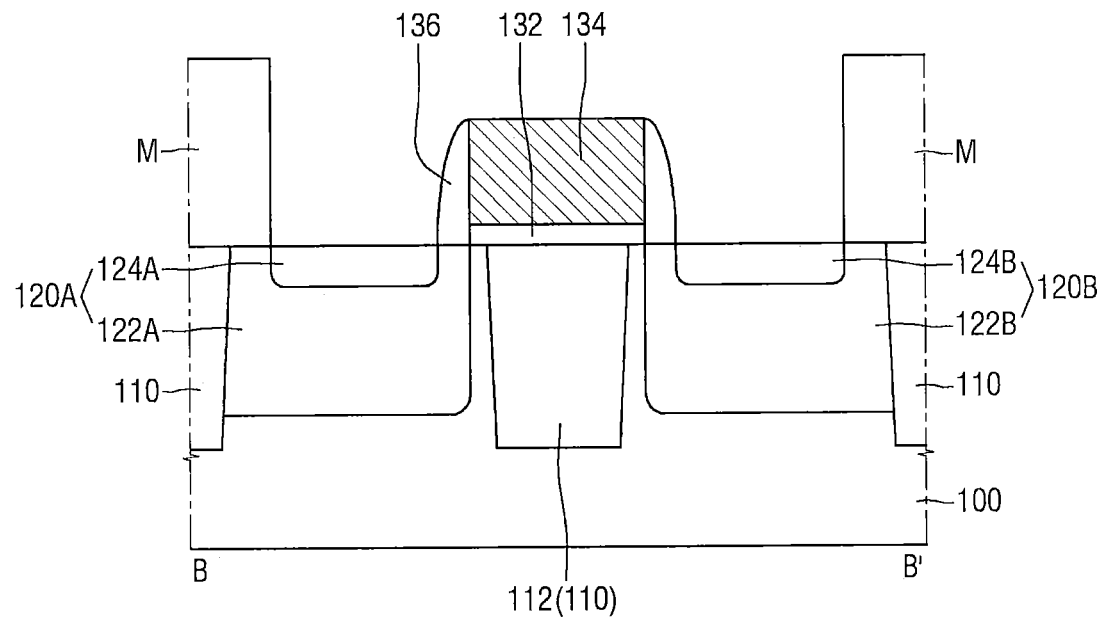
Figure 25:
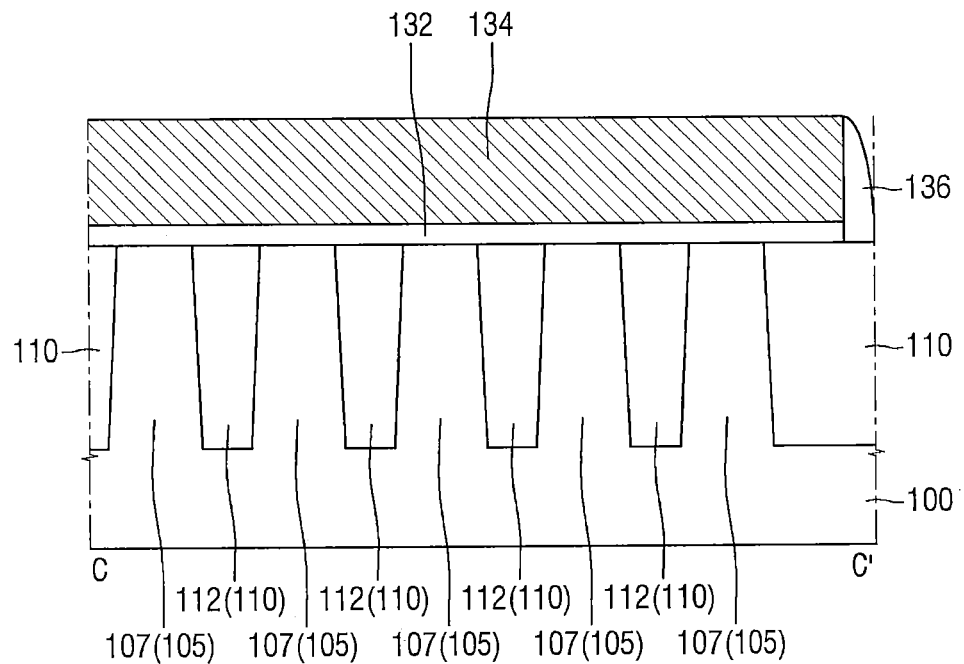

Referring to FIGS. 22 to 25, a gate spacer 136 may be formed on side walls of the first gate electrode 134. Subsequently, the first high-concentration impurity region 124A and the second high-concentration impurity region 124B may be formed in the substrate 100. For reference, FIG. 23 is a cross-sectional view taken along line A-A' of FIG. 22. FIG. 24 is a cross-sectional view taken along line B-B' of FIG. 22. FIG. 25 is a cross-sectional view taken along the line C-C' of FIG. 22.

For example, an insulating layer extending along the profile of the substrate 100, the gate dielectric layer 132 and the first gate electrode 134 may be formed. Next, by performing the etching process on the insulating layer, a gate spacer 136 extending along the side wall of the gate dielectric layer 132 and the side wall of the first gate electrode 134 may be formed.

Subsequently, the first high-concentration impurity region 124A and the second high-concentration impurity region 124B may be formed in the first low-concentration impurity region 122A and the second low-concentration impurity region 122B, respectively. The first high-concentration impurity region 124A and the second high-concentration impurity region 124B may be formed by doping impurities into the substrate 100. For example, an ion implantation process which uses the first gate electrode 134 and the gate spacer 136 as a mask may be performed.

The first high-concentration impurity region 124A and the second high-concentration impurity region 124B may be doped with the second conductivity type. For example, when the semiconductor device according to some embodiments is an n-type transistor, the first high-concentration impurity region 124A and the second high-concentration impurity region 124B may be doped with the n-type impurity. However, the doping concentration of the first high-concentration impurity region 124A may be higher than the doping concentration of the first low-concentration impurity region 122A. Further, the doping concentration of the second high-concentration impurity region 124B may be higher than the doping concentration of the second low-concentration impurity region 122B.

The method for fabricating the semiconductor device according to some embodiments may include forming the first high-concentration impurity region 124A and the second high-concentration impurity region 124B using a mask pattern M. For example, an ion implantation process which uses the first gate electrode 134, the gate spacer 136 and the mask pattern M as a mask may be performed.

The mask pattern M may be formed to overlap a part of the first low-concentration impurity region 122A and a part of the second low-concentration impurity region 122B. Therefore, the first high-concentration impurity region 124A that is at least partly surrounded by the first low-concentration impurity region 122A may be formed, and the second high-concentration impurity region 124B that is at least partly surrounded by the second low-concentration impurity region 122B may be formed.

After the first high-concentration impurity region 124A and the second high-concentration impurity region 124B are formed, the mask pattern M may be removed.

Next, referring to FIGS. 1 to 4, the interlayer insulating layer 150 may be formed on the substrate 100. Subsequently, a first contact 142 and a second contact 144 penetrating the interlayer insulating layer 150 may be formed.

For example, an interlayer insulating layer 150 which covers the active region 105, the device isolation layer 110, the first gate electrode 134 and the gate spacer 136 may be formed. Subsequently, at least one first contact 142 connected to the first source/drain region 120A and the second source/drain region 120B may be formed through the interlayer insulating layer 150. Further, at least one second contact 144 connected to the first gate electrode 134 may be formed through the interlayer insulating layer 150.

The method for fabricating the semiconductor device according to some embodiments may further include formation of the first silicide layer 126. The first silicide layer 126 may be formed on the first and second source/drain regions 120A and 120B. For example, a metal film may be formed on the first source/drain region 120A and the second source/drain region 120B and a silicidation process may be performed. As a result, the first contact 142 may directly come into contact with the first silicide layer 126.

The method for fabricating the semiconductor device according to some embodiments may further include forming a second silicide layer 138. The second silicide layer 138 may be formed on the first gate electrode 134. For example, a metal film may be formed on the first gate electrode 134 and the silicidation process may be performed. As a result, the second contact 144 may directly come into contact with the second silicide layer 138.

Therefore, a semiconductor device having the adjusted threshold voltage and the desirable current characteristics may be fabricated by a simplified process.

Figure 26:
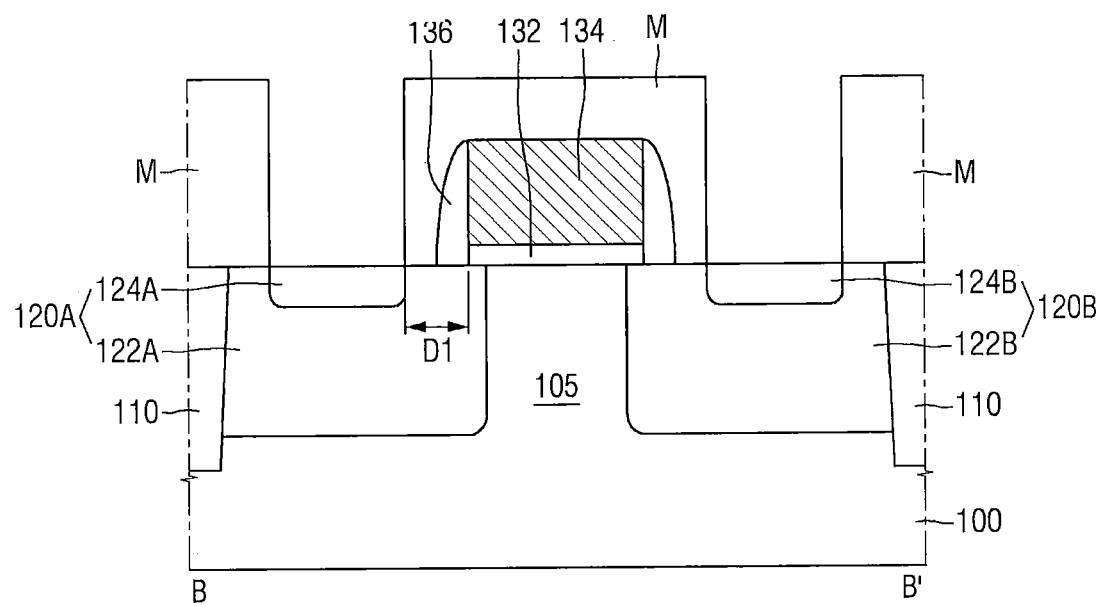
FIG. 26 is a layout diagram for explaining a layout design method for a semiconductor device according to some embodiments of the present inventive concepts.

FIG. 26 is a layout diagram for explaining a layout design method for a semiconductor device according to some embodiments of the present inventive concepts. For the sake of convenience of explanation, parts of description provided referring to FIGS. 1 to 25 may be briefly described or omitted in favor of the previously provided description. For reference, FIG. 26 is a diagram for explaining the procedures subsequent to FIG. 19.

Referring to FIG. 26, the gate spacer 136 may be formed on the side wall of the first gate electrode 134. Subsequently, the first high-concentration impurity region 124A and the second high-concentration impurity region 124B spaced apart from the gate spacer 136 may be formed in the substrate 100.

Since the formation of the gate spacer 136 is substantially the same as that described above in the description of FIGS. 22 to 25, the detailed explanation thereof will not be provided below.

Subsequently, the first high-concentration impurity region 124A and the second high-concentration impurity region 124B may be formed using the mask pattern M. For example, an ion implantation process which uses the mask pattern M as a mask may be performed.

The mask pattern M may be formed to overlap a part of the first low-concentration impurity region 122A and a part of the second low-concentration impurity region 122B. Further, the mask pattern M may be formed to cover the first gate electrode 134 and the gate spacer 136. Therefore, the first high-concentration impurity region 124A and the second high-concentration impurity region 124B spaced apart from the gate spacer 136 may be formed.

In some embodiments, the side wall of the mask pattern M which covers the first gate electrode 134 and the gate spacer 136 may be formed to be spaced apart by a first distance D1 from the side wall of the first gate electrode 134. Therefore, for example, a first high-concentration impurity region 124A spaced apart from the first gate electrode 134 by the first distance D1 may be formed.

Hereinafter, a layout design method for a semiconductor device according to some embodiments of the present inventive concepts will be described with reference to FIG. 27.

Figure 27:
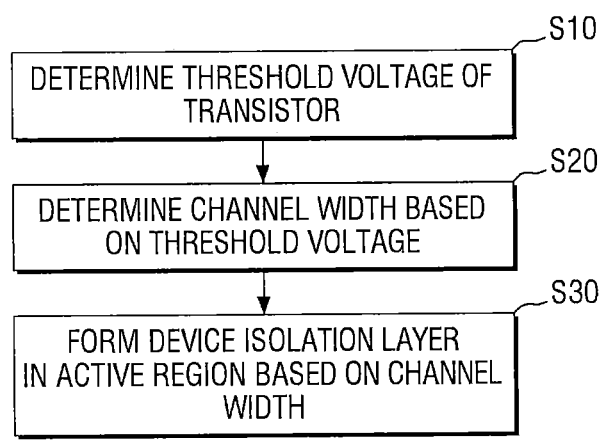
FIG. 27 is a flowchart for explaining a layout design method for a semiconductor device according to some embodiments of the present inventive concepts.

FIG. 27 is a flowchart for explaining the layout design method for the semiconductor device according to some embodiments of the present inventive concepts. For the sake of convenience of explanation, repeated parts of description provided referring to FIGS. 1 to 26 will be briefly described or omitted.

Referring to FIG. 27, the threshold voltage of the transistor is determined (S10).

For example, for product applications, the semiconductor device may include high-voltage transistors of various sizes driven at various voltages. Also, various high-voltage transistors may require threshold voltages different from each other. At this time, the threshold voltage of the high-voltage transistor may be determined in accordance with the required high-voltage transistor.

Next, the channel width of the transistor is determined on the basis of the determined threshold voltage (S20).

For example, as illustrated in FIG. 7, it is possible to measure the threshold voltage of the high-voltage transistor which changes depending on the channel width of the high-voltage transistor. Next, on the basis of the determined threshold voltage, the channel width of the corresponding high-voltage transistor may be determined.

For example, in a case where the linear threshold voltage of the determined high-voltage transistor is about 1.10V, a channel width of about 10 μm may be determined as the channel width of the high-voltage transistor. For example, in a case where the linear threshold voltage of the determined high-voltage transistor is about 0.80V, the channel width of about 1 μm may be determined as the channel width of the high-voltage transistor.

Next, a device isolation layer is formed in the active region on the basis of the determined channel width (S30).

For example, a plurality of device isolation layers may be formed in the active region such that the high-voltage transistor has a plurality of channels having the determined channel width. For example, as described above with reference to FIGS. 14 to 17, the device isolation layer 110 may be formed in the active region 105.

Therefore, a semiconductor device having the adjusted threshold voltage and the desirable current characteristics can be fabricated by the simplified process.

Those skilled in the art will appreciate that many variations and modifications may be made to the preferred embodiments without substantially departing from the principles of the present inventive concepts. Therefore, the disclosed embodiments discussed herein are used in a generic and descriptive sense only and not for purposes of limitation.

What is claimed is:

1. A semiconductor device comprising:
a device isolation layer which defines an active region in a substrate, wherein the substrate is doped with a first conductivity type;
a gate electrode extending in a first direction on the active region;
a high-concentration impurity region in the active region on a side of the gate electrode, wherein the high-concentration impurity region extends in the first direction and is doped with a second conductivity type different from the first conductivity type; and
a low-concentration impurity region in the active region, wherein the low-concentration impurity region at least partly surrounds the high-concentration impurity region and is doped with the second conductivity type,
wherein the active region includes a plurality of connecting sections that are below the gate electrode, each connecting section protruding from the low-concentration impurity region and extending in a second direction that intersects the first direction,
wherein the device isolation layer includes a plurality of separating sections below the gate electrode, and
wherein the plurality of connecting sections and the plurality of separating sections are alternately arranged along the first direction.

2. The semiconductor device of claim 1, wherein the gate electrode overlaps each of the connecting sections and each of the separating sections.

3. The semiconductor device of claim 1, wherein a width of each of the connecting sections in the first direction is 10 μm or less.

4. The semiconductor device of claim 1, wherein a width of each of the separating sections in the first direction is 1 μm or less.

5. The semiconductor device of claim 1, wherein the gate electrode is configured to receive a voltage of 5V to 100V.

6. The semiconductor device of claim 1, further comprising:
a gate dielectric layer between the active region and the gate electrode,
wherein the gate dielectric layer has a thickness of 200 Å or more.

7. The semiconductor device of claim 1, wherein the gate electrode includes a plurality of conductive patterns spaced apart from each other and extending in the first direction.

8. The semiconductor device of claim 1, wherein a center line passing through a center of each of the connecting sections and extending in the first direction is defined, and
wherein a first distance from the center line to a first side of the gate electrode is different from a second distance from the center line to a second side of the gate electrode that is opposite from the first side.

9. The semiconductor device of claim 1, wherein the gate electrode includes polycrystalline silicon (poly Si).

10. A semiconductor device comprising:
a device isolation layer which defines an active region in a substrate;
a gate electrode extending in a first direction on the active region;
a first source/drain region extending in the first direction in the active region on a first side of the gate electrode;
a second source/drain region extending in the first direction in the active region on a second side of the gate electrode,
wherein the active region includes a plurality of connecting sections under the gate electrode which connect the first source/drain region and the second source/drain region, and are spaced apart from each other by the device isolation layer,
wherein the gate electrode is configured to receive a voltage of 5V to 100V, and
wherein a width of each of the connecting sections in the first direction is 10 µm or less.

11. The semiconductor device of claim 10, wherein the plurality of connecting sections is arranged along the first direction.

12. The semiconductor device of claim 10, wherein each of the connecting sections extends in a second direction that intersects the first direction.

13. The semiconductor device of claim 10, wherein the first source/drain region includes a first high-concentration impurity region, and a first low-concentration impurity region which at least partly surrounds the first high-concentration impurity region, and
wherein the second source/drain region includes a second high-concentration impurity region, and a second low-concentration impurity region which at least partly surrounds the second high-concentration impurity region.

14. The semiconductor device of claim 13, wherein the plurality of connecting sections directly connects the first low-concentration impurity region and the second low-concentration impurity region.

15. The semiconductor device of claim 10, wherein the first source/drain region and the second source/drain region comprise the same material.

16. The semiconductor device of claim 10, further comprising:
a first silicide layer on the gate electrode; and
a second silicide layer on the first source/drain region and the second source/drain region.

17. A semiconductor device comprising:
a substrate including a first region and a second region;
a device isolation layer which defines an active region in the substrate;
a first transistor of a first conductivity type on the first region; and
a second transistor of the first conductivity type on the second region,
wherein the first transistor includes a first gate electrode extending in a first direction on the active region,
wherein the second transistor includes a second gate electrode extending in a second direction on the active region,
wherein the active region of the first region includes a plurality of first connecting sections spaced apart from each other by the device isolation layer, below the first gate electrode,
wherein the active region of the second region includes a plurality of second connecting sections spaced apart from each other by the device isolation layer, below the second gate electrode,
wherein a first width of each of the first connecting sections in the first direction is smaller than a second width of each of the second connecting sections in the second direction, and
wherein a first threshold voltage of the first transistor is lower than a second threshold voltage of the second transistor.

18. The semiconductor device of claim 17, wherein each of the first connecting sections extends in a third direction that intersects with the first direction, and
wherein each of the second connecting sections extends in a fourth direction that intersects with the second direction.

19. The semiconductor device of claim 17, wherein the device isolation layer includes a plurality of first separating sections below the first gate electrode, and a plurality of second separating sections below the second gate electrode,
wherein the plurality of first connecting sections and the plurality of first separating sections are alternately arranged along the first direction, and
wherein the plurality of second connecting sections and the plurality of second separating sections are alternately arranged along the second direction.

20. The semiconductor device of claim 19, wherein a third width of each of the first separating sections in the first direction is substantially the same as a fourth width of each of the second separating sections in the second direction.

* * * * *